United States Patent
Horvath et al.

(10) Patent No.: US 10,172,231 B2
(45) Date of Patent: Jan. 1, 2019

(54) METHODS AND APPARATUS FOR REDUCING RF CROSSOVER COUPLING

(71) Applicant: pSemi Corporation, San Diego, CA (US)

(72) Inventors: Gregory Louis Horvath, Scotts Valley, CA (US); Peter Bacon, Derry, NH (US)

(73) Assignee: pSemi Corporation, San Diego, CA (US)

(*) Notice: Subject to any disclaimer, the term of this patent is extended or adjusted under 35 U.S.C. 154(b) by 106 days.

(21) Appl. No.: 15/176,940

(22) Filed: Jun. 8, 2016

(65) Prior Publication Data
US 2017/0359056 A1    Dec. 14, 2017

(51) Int. Cl.
| | |
|---|---|
| *H05K 1/02* | (2006.01) |
| *H01P 3/00* | (2006.01) |
| *H01P 1/12* | (2006.01) |
| *H04B 1/48* | (2006.01) |

(52) U.S. Cl.
CPC .......... *H05K 1/0228* (2013.01); *H01P 1/127* (2013.01); *H01P 3/003* (2013.01); *H04B 1/48* (2013.01); *H05K 1/0216* (2013.01)

(58) Field of Classification Search
CPC .. H04B 1/48; H04B 1/44; H01P 1/127; H01P 1/10; H01P 1/15; H01H 9/54; H03K 17/063; H03K 17/693; H01L 27/0207
USPC .................................. 333/1, 103, 104, 262
See application file for complete search history.

(56) References Cited

U.S. PATENT DOCUMENTS

| | | | |
|---|---|---|---|
| 5,510,757 A | 4/1996 | Kumar et al. | |
| 5,696,470 A | 12/1997 | Gupta et al. | |
| 5,969,560 A | 10/1999 | Kohama et al. | |
| 6,653,697 B2 | 11/2003 | Hidaka et al. | |
| 7,138,846 B2 | 11/2006 | Suwa et al. | |
| 7,221,207 B2 | 5/2007 | Fujumoto et al. | |
| 7,880,559 B2 | 2/2011 | Ouacha et al. | |
| 9,131,604 B1 * | 9/2015 | Watt ..................... | H05K 1/0245 |

(Continued)

OTHER PUBLICATIONS

Takaoka, Dean, Office Action received from the USPTO dated Feb. 16, 2018 for U.S. Appl. No. 15/377,626, 19 pgs.

(Continued)

*Primary Examiner* — Benny Lee
*Assistant Examiner* — Hafizur Rahman
(74) *Attorney, Agent, or Firm* — Jaquez Land Greenhaus LLP; Martin J. Jaquez, Esq.; Alessandro Steinfl, Esq.

(57) ABSTRACT

Systems, methods, and apparatus for reducing crossover coupling of two or more RF signals are described. In one case, a crossover structure is described where RF signals are routed through coplanar waveguides having a specific characteristic impedance and crossing at a central point of the crossover structure by way of a bridge. A ground shield having a geometry adapted to reduce the crossover coupling while minimally affecting capacitive coupling between the RF signals and the ground shield is introduced in-between a region comprising the central point. Further described is a multi-port rotary RF switch fitted with the crossover structure which allows substantially balanced electrical performance across all the operational states of the rotary RF switch at RF signal frequencies up to 40 GHz and beyond.

27 Claims, 26 Drawing Sheets

(56) References Cited

U.S. PATENT DOCUMENTS

2014/0306776 A1* 10/2014 Eom .................. H01P 3/003
                                                    333/1
2014/0327495 A1    11/2014  He et al.
2017/0359056 A1    12/2017  Horvath et al.
2017/0359058 A1    12/2017  Bacon

OTHER PUBLICATIONS

Bacon, Peter, Response filed in the USPTO dated May 3, 2018 for U.S. Appl. No. 15/377,626, 19 pgs.
Takaoka, Dean, Notice of Allowance received from the USPTO dated Aug. 15, 2018 for U.S. Appl. No. 15/377,626, 16 pgs.

* cited by examiner

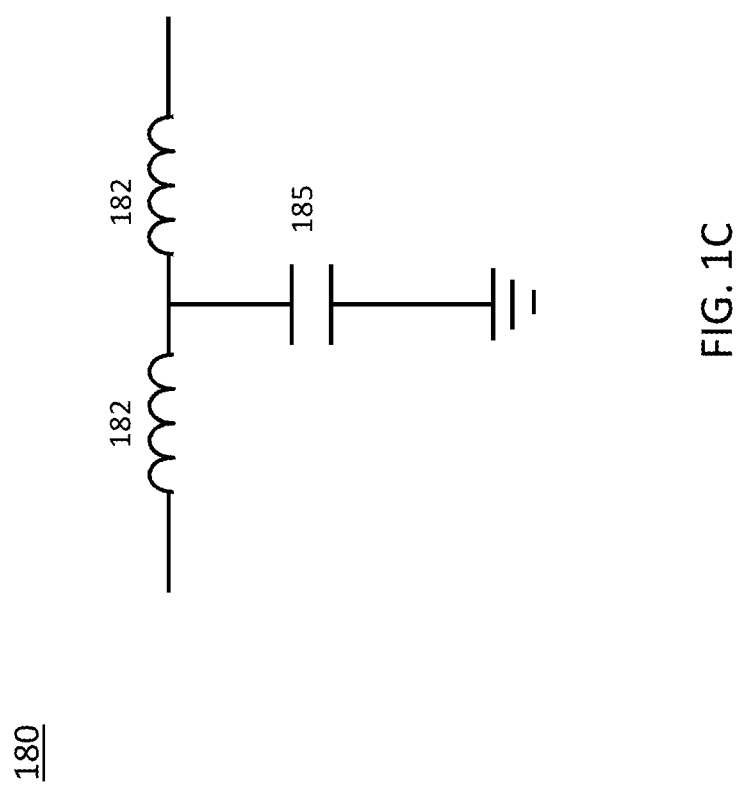

| State | 112 | 124 | 134 | 141 | 131 | 124 |
|---|---|---|---|---|---|---|
| A0 | off | off | off | off | off | off |
| 1 | ON | off | off | off | off | off |
| 2 | off | ON | off | off | off | off |
| 3 | off | off | ON | off | off | off |
| 4 | off | off | off | ON | off | off |
| 5 | off | off | off | off | ON | off |
| 6 | off | off | off | off | off | off |
| 7 | ON | ON | ON | ON | off | ON |
| 8 | off | off | off | off | off | off |
| 9 | off | off | off | off | ON | ON |

FIG. 1D

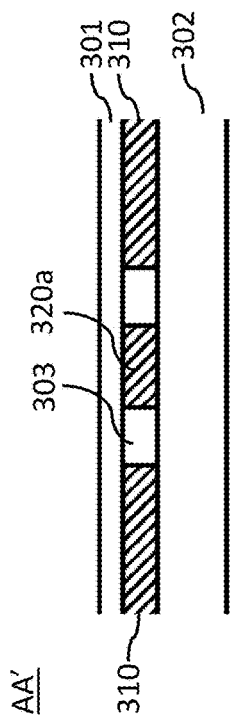
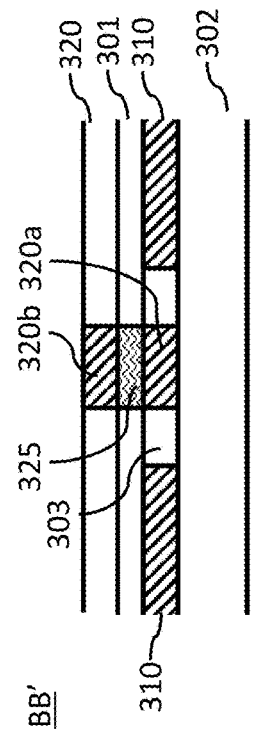
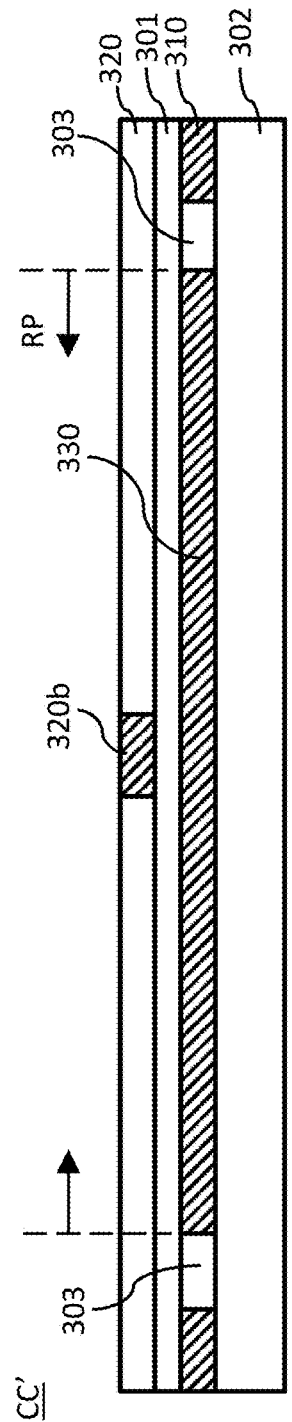

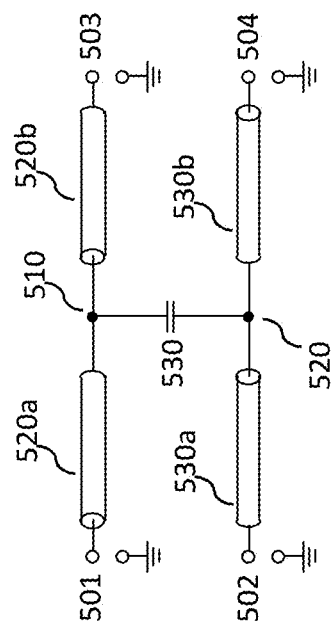
FIG. 5
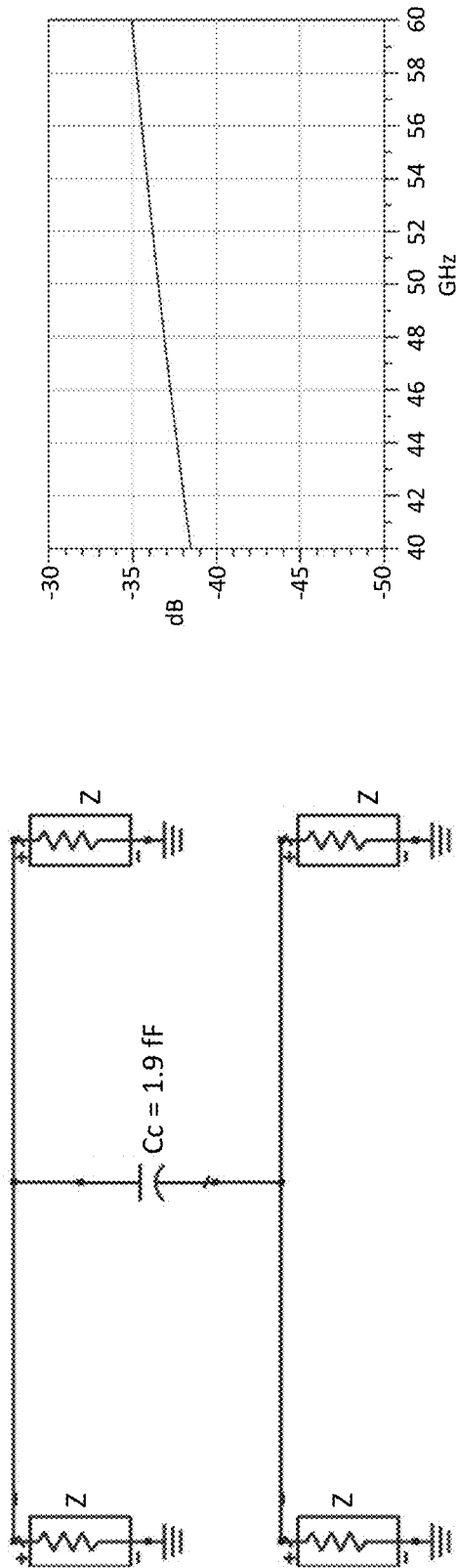
FIG. 6B
FIG. 6A

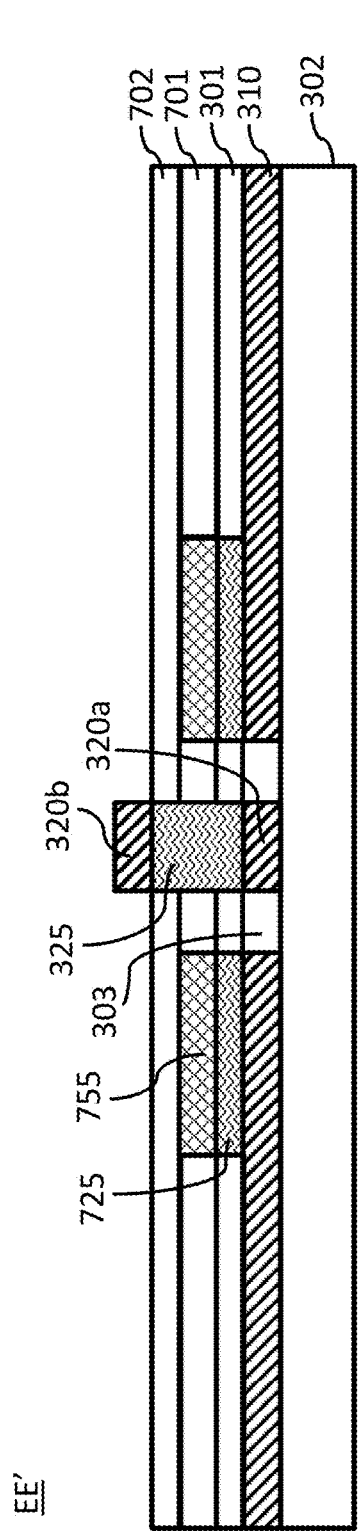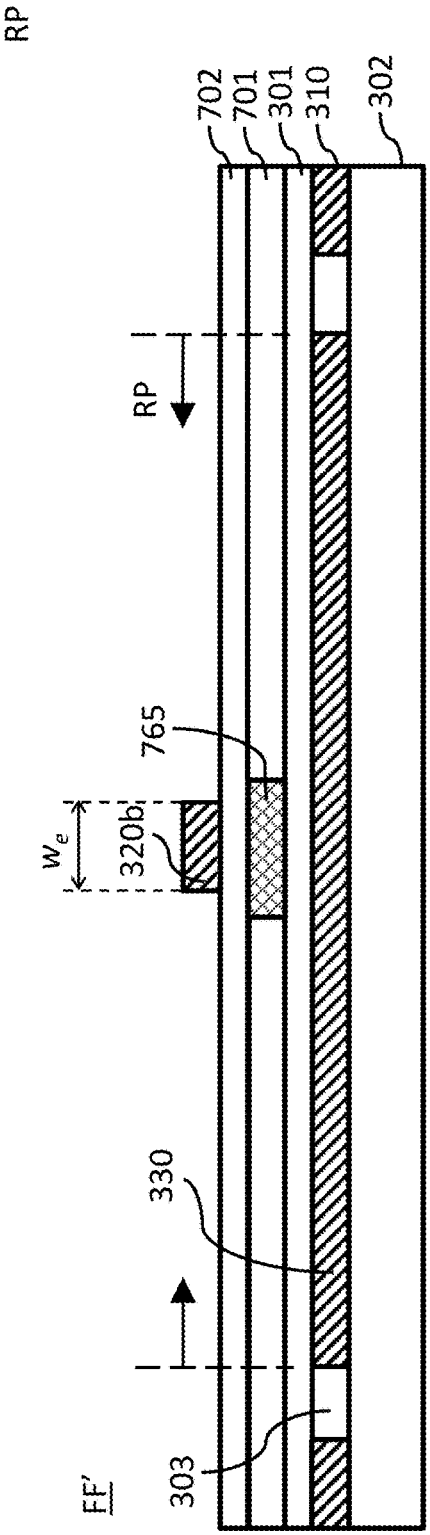
FIG. 7C
FIG. 7D

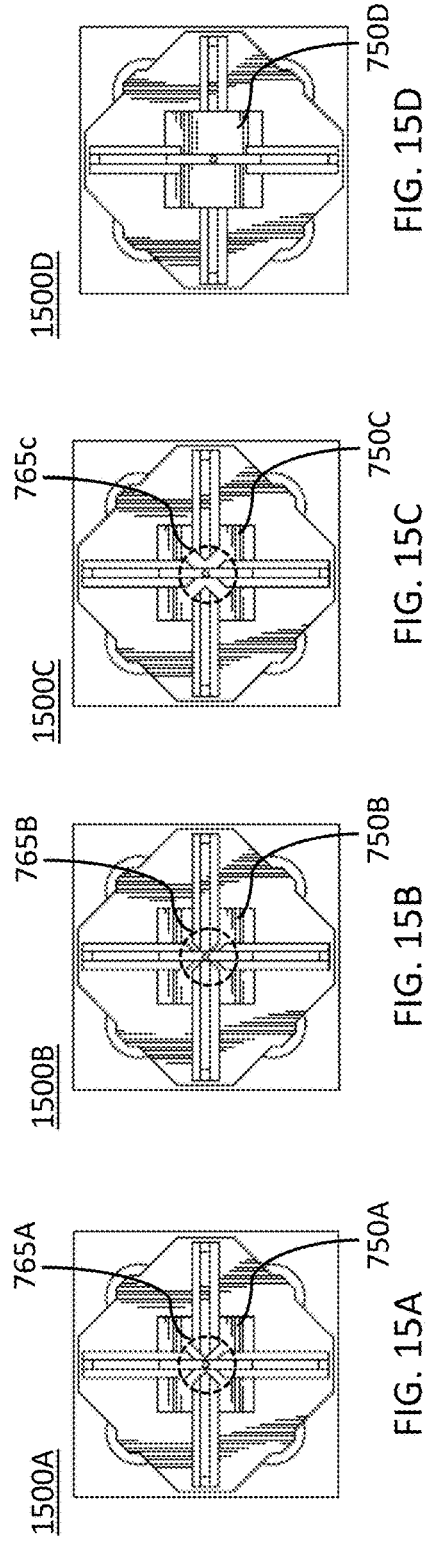
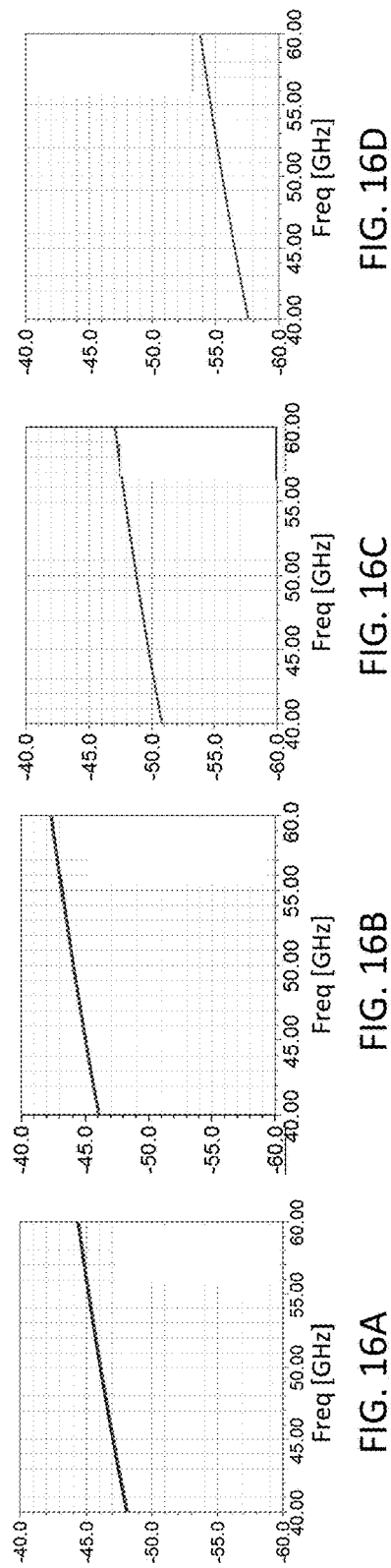

METHODS AND APPARATUS FOR REDUCING RF CROSSOVER COUPLING

TECHNICAL FIELD

Various embodiments described herein relate generally to systems, methods, and apparatus for reducing crossover coupling of two or more radio frequency (RF) signals.

BACKGROUND

A radio frequency (RF) circuit may require one or more crossover paths where RF signal paths cross. Such crossover paths can induce undesired crossover coupling, primarily by way of mutual capacitive coupling, between RF signals conducted in the paths with negative effects over circuit performance. Prior art embodiments address such negative effects by inserting a ground layer in-between the crossover paths. In turn, such ground layer can introduce capacitive coupling between each of the RF signal paths and ground, and therefore reduce, or adversely affect, an operating frequency range of the RF circuit. It may therefore be desirable to provide crossover paths with reduced crossover coupling and reduced capacitive coupling to ground.

SUMMARY

According to a first aspect of the present disclosure, an integrated circuit is presented, the integrated circuit comprising: a first non-conductive layer; a first metal layer overlying the first non-conductive layer, the first metal layer comprising: i) a ground return region of a substantially symmetrical shape with respect to a centerline of the ground return region, isolated from a remaining portion of the first metal layer; ii) a first transmission line of a substantially symmetrical shape with respect to the centerline, formed within the ground return region, separated from the ground return region by a fixed distance gap along a length of the first transmission line; and iii) a second transmission line of a substantially symmetrical shape with respect to the centerline, formed within the ground return region, the second transmission line comprising a first segment and a last segment collinear with the first segment, the first segment and the last segment separated from the ground return region by the fixed distance gap along the length of the first and last segments, the first segment and the last segment separated from one another at a middle region of the second transmission line; a second non-conductive layer overlying the first metal layer; and a second metal layer comprising a middle segment of the second transmission line collinear with the first and last segments and electrically connected to the first and last segments through vias formed in the second non-conductive layer, wherein: the first transmission line and the second transmission line cross at the middle region of the second transmission line to form a symmetrical crossing pattern with respect to the centerline.

According to a second aspect of the present disclosure, an integrated circuit is presented, the integrated circuit comprising: a first coplanar waveguide comprising a first transmission line; a second coplanar waveguide comprising a second transmission line, the first coplanar waveguide crossing the second coplanar waveguide, wherein: the first coplanar waveguide and the second coplanar waveguide are formed on a same metal layer of a layered substrate at the exception of a middle segment of the second transmission line formed on a different metal layer of the layered substrate.

According to third aspect of the present disclosure, a method for reducing cross coupling between two crossing conduction paths is presented, the method comprising: forming a first conduction path comprising one or more of a same first conduction unit element series connected with a first coplanar waveguide having a first transmission line; forming a second conduction path comprising one or more of a same second conduction unit element series connected with a second coplanar waveguide having a second transmission line; crossing the first transmission line and the second transmission line, the first and the second transmission lines formed on a first metal layer of a layered substrate; based on the crossing, forming a crossing region of the first and the second transmission lines; breaking the second transmission line at the crossing region; based on the breaking, obtaining a first segment and a last segment separated from the first segment of the second transmission line; based on the obtaining, forming a middle segment of the second transmission line in a second metal layer of the layered substrate; forming a shield in third metal layer of the layered substrate, the third metal layer being between the first and the second metal layers; based on the forming of the shield, controlling a coupling between the first transmission line and the second transmission line at the crossing region; and based on the controlling, reducing a cross coupling between the first transmission line and the second transmission line.

BRIEF DESCRIPTION OF THE DRAWINGS

The accompanying drawings, which are incorporated into and constitute a part of this specification, illustrate one or more embodiments of the present disclosure and, together with the description of example embodiments, serve to explain the principles and implementations of the disclosure.

FIG. 1C shows a circuit diagram of a unit element of a switchable conduction path, the unit element comprising a series inductive path and a shunted capacitance.

FIG. 1D shows an exemplary state table representative of operational states of the 4-port monolithic switch of FIG. 1A based on the states of the six distinct switchable conduction paths.

FIGS. 3B, 3C, 3D and 3E respectively show the cross section views AA', BB', CC' and DD' indicated in FIG. 3A

FIG. 5 shows a circuit model representative of the basic crossover structure of FIG. 3A.

FIG. 6A shows a lumped element model of the basic crossover structure of FIG. 3A based on the circuit model of FIG. 5.

FIG. 6B shows a graph representing simulation results of the impact of a mutual capacitive coupling in the lumped element model of FIG. 6A.

FIGS. 7C, 7D and 7E respectively show the cross section views EE', FF' and GG' indicated in FIG. 7A.

FIGS. 15A, 15B, 15C and 15D show exemplary embodiments according to the present disclosure of the crossover structure with ground shield of FIG. 7A, where the geometries of the ground shield differ.

FIGS. 16A, 16B, 16C and 16D show graphs representing impact on crossover isolation of the differing ground shields of the crossover structures of FIGS. 15A, 15B, 15C and 15D respectively.

Like reference numbers and designations in the various drawings indicate like elements.

DETAILED DESCRIPTION

Throughout this description, embodiments and variations are described for the purpose of illustrating uses and implementations of the inventive concept. The illustrative description should be understood as presenting examples of the inventive concept, rather than as limiting the scope of the concept as disclosed herein.

Apparatus and methods that provide a reduction in crossover coupling of two or more RF signals through crossing conduction paths are described in the present disclosure. As used herein, a "conduction path", or a "low resistivity conduction path", refers to a low resistivity circuit element suited for conducting an RF signal with low loss. An example of a passive conduction path is a piece of conductive metal, such as copper, aluminum and gold, or any other low loss metal known to a person skilled in the art. Other examples of passive conduction paths suited for usage in integrated circuits operating at higher frequencies (e.g. 30 GHz, 40 GHz and higher) are microstrips, transmission lines and coplanar waveguides, all of which are well known to a person skilled in the art. An example of an active conduction path is a drain to source channel of a transistor, which is equivalent to a low impedance conduction path when the transistor is ON (conducting), and a high impedance conduction path when the transistor is OFF (non-conducting). Such active conduction path can be referred to as a "switchable" conduction path. By virtue of a constituent active device (e.g. transistor), an active conduction path can have different impedances based on an operational states of the active device.

As known to a person skilled in the art, a monolithically integrated circuit, which may contain a plurality of passive and/or active conduction paths interconnecting various nodes/elements of the circuit, can comprise one or more stacked layers (e.g. metal/conductive layer, non-conductive layer, dielectric layer, etc.) where the conduction paths are created. In some cases, such conduction paths are created across the stacked layers and connected through vias. In some cases, it may be desired to provide conduction paths of matching electrical characteristics, such as matching impedances and matching couplings and/or electrical interactions with other nodes/elements of the circuit, in order to provide matching electrical performances across nodes interconnected by such conduction paths. To this end, it may be necessary to route such conduction paths in a manner that two or more such paths cross, as illustrated by the crossover paths in the crossover region (150) of FIG. 1A.

Figure 1A:
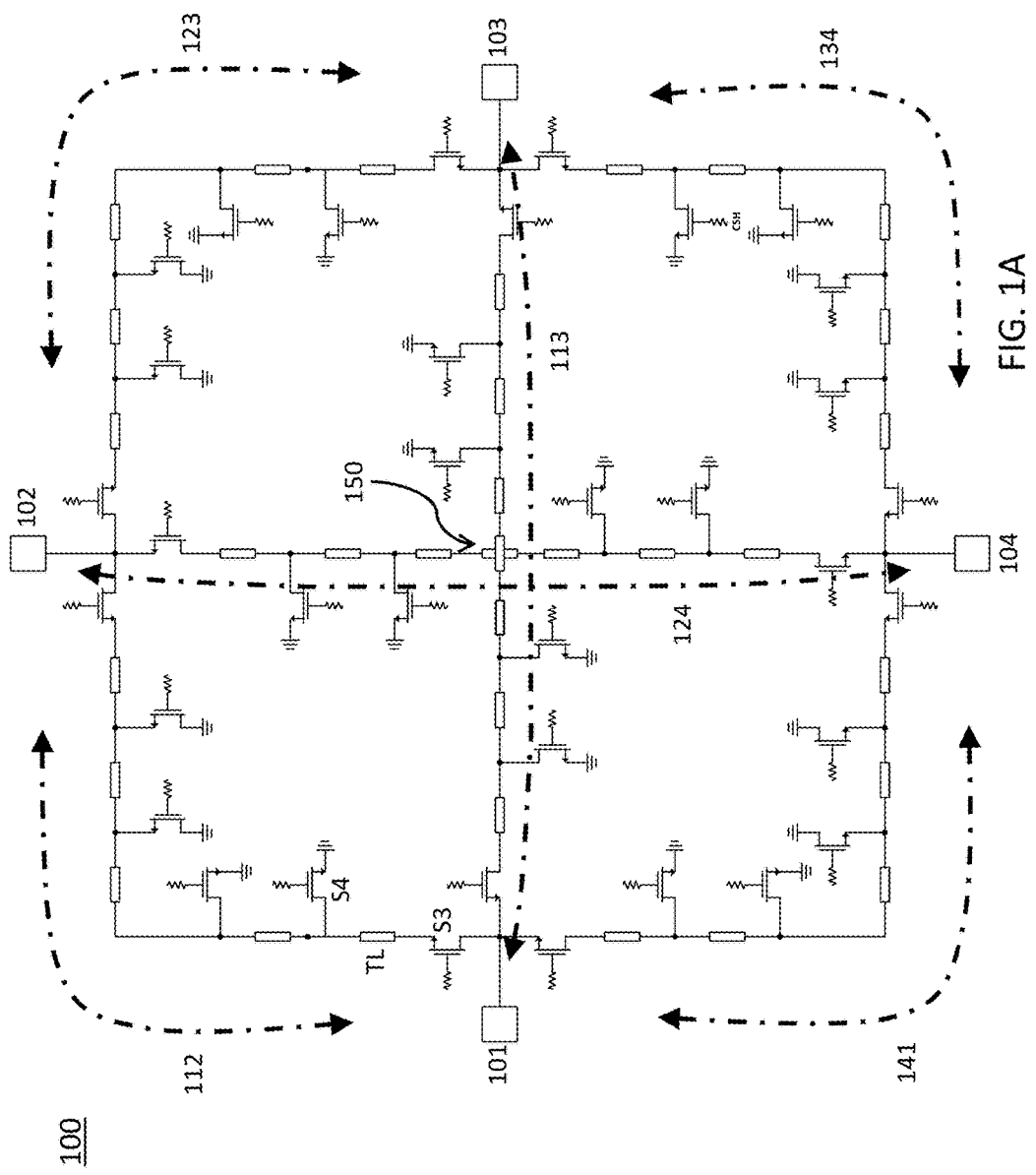
FIG. 1A shows a circuit diagram of a 4-port monolithic switch comprising six distinct switchable conduction paths, each switchable conduction path selectively connecting/disconnecting two of the four ports.
Figure 1B:
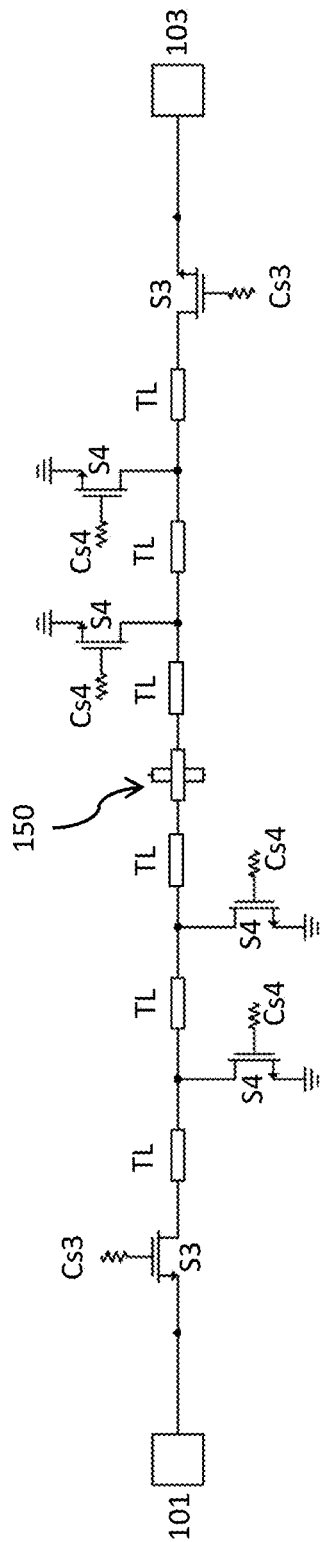
FIG. 1B shows a larger view of a switchable conduction path of the switch depicted in FIG. 1A which selectively connects/disconnects ports 101 and 103.

FIG. 1A represents a circuit diagram and layout of a 4-port monolithic switch (100), commonly referred to as a C-R-T switch, which can selectively connect any one of the four ports; port1 (101), port2 (102), port 3 (103) and port4 (104), to a next port, such as, for example, port1 (101) to port 2 (102) by way of switchable conduction path (112), port2 (102) to port3 (103) by way of switchable conduction path (123), port3 (103) to port4 (104) by way of switchable conduction path (134), port4 (104) to port1 (101) by way of switchable conduction path (141), or to an opposite port, such as, for example, port1 (101) to port3 (103) by way of switchable conduction path (113), or port2 (102) to port4 (104) by way of switchable conduction path (124). Each switchable conduction path (112, 123, 134, 141, 113, 124) comprises series (S3) and shunted (S4) transistors interconnected by controlled impedance transmission lines (TL), the transistors operating as switches to enable/disable connection of the ports by presenting a low/high resistivity path between such ports. FIG. 1B depicts a larger view of the switchable conduction path (113), where (Cs3, Cs4) represent control signals to the transistors (S3, S4) which cause such transistors to either turn ON (conduct) or turn OFF (not conduct). In order to provide a balanced performance (a same RF performance for each of the switchable conduction paths) of the switch (100), each of the switchable conduction paths (112, 123, 134, 141, 113, 124) can be made to have similar components and a similar layout, as suggested by the circuit diagram and layout of switch (100) shown in FIG. 1A. Performance of the switch (100) can be measured, for example, by RF performance parameters such as return loss, insertion loss and isolation at a frequency range of interest (e.g. [DC—50 GHz]), all such parameters are well known to a person skilled in the art. Conversely, the switchable conduction paths can be made asymmetrical, where the RF performance parameters may be optimized differently for each path, or group of paths (e.g. unit element (180), later described, with different characteristics).

According to an embodiment of the present disclosure, each switchable conduction path (112, 123, 134, 141, 113, 124) is constructed using a unit element (180) as depicted in FIG. 1C. Such unit element (180) comprises a series inductive path (182) representing a controlled inductance of a transmission line (TL) depicted in FIG. 1B, and a shunted capacitance (185) representing an OFF capacitance of a shunted transistor S4 (in the OFF state of the transistor) depicted in FIG. 1B. According to a further embodiment of the present disclosure the combination of the value, L, of the inductance 182, and the value, $C_{off}$, of the OFF capacitance (185), are selected so as a corresponding resonant frequency of the unity element (180), represented by $f_r=1/[2\pi (2LC_{off})^{0.5}]$, is higher than an operating frequency of an RF signal conducted in the switchable conduction path (e.g. 112, 123, 134, 141, 113, 124) formed by such unity element (a plurality of such elements), while maintaining a desired characteristic impedance of the switchable conduction path, as represented by $Z_c=(2L/C_{off})^{0.5}$. According to an embodiment of the present disclosure, the desired characteristic impedance $Z_c$ can be 50 ohms, and the operating frequency can be represented by any frequency within a passband range of frequencies within which a conducted RF signal operates. As can be seen by the formula above for the resonant frequency $f_r$, smaller values of L and $C_{off}$ may be required in order to provide a higher value of the resonant frequency $f_r$, in which case a physical size of the unity element (180) may be smaller, and therefore more such unit elements (180) may be required in order to provide a desired physical length of a switchable conduction path (112, 123, 134, 141, 113, 124) of the switch (100) depicted in FIG. 1A. A person skilled in the art readily understands relationships linking physical size of a transmission line with a corresponding inductance value, and physical size of a transistor (e.g. switch) with a corresponding OFF capacitance value.

With further reference to FIG. 1A, considering the switchable conduction path (112) connecting port1 (101) to port2 (102), it comprises a first series connected transistor (S3) coupled to the port1 (101), a last series connected transistor (S3) coupled to the port2, four shunt connected transistors (S4) connected between the first and the last series connected transistors, and five series connected transmission lines (TL) of controlled impedance, each placed in-between two of the series/shunt connected transistors. When the switchable conduction path (112) is enabled and therefore port1 (101) is (electrically) connected to port2 (102), the series connected transistors (S3) are ON (conducting), providing a low resistivity path in series between port1 (101) and port2 (102), and the shunt connected transistors (S4) are OFF (non-conducting), providing a high resistivity path to ground in parallel between port1 (101) and port2 (102). When the switchable conduction path (112) is disabled and therefore port1 (101) is (electrically) disconnected from port2 (102), the series connected transistors (S3) are OFF (non-conducting), providing a high resistivity path in series between port1 (101) and port2 (102), and the shunt connected transistors (S4) are ON (conducting), providing a low resistivity path to ground in parallel between port1 (101) and port2 (102). The person skilled in the art realizes that the expressions electrically connected ports and electrically disconnected ports can be defined in terms of electrical parameters such as insertion loss of and isolation between the ports, both of which are well understood in the art. As used herein, two ports can be defined as (electrically) disconnected when an insertion loss measured between such ports is over 40 dB at a frequency range of DC up to 30 GHz and above, and two ports can be defined as (electrically) connected when an insertion loss measured between such ports is less than 5 dB at a frequency range of DC up to 30 GHz and above.

The symmetrical layout of the switch (100) coupled with the distributed nature of the provided paths (112, 123, 134, 141, 113, 124) allow for equal performance of the switch (100) when any two ports (port1-port4) of the switch (100) are connected. However, in cases where more than one pair of connected ports is desired, such as, for example, simultaneously connecting port1 (101) to port3 (103) and port2 (102) to port4 (104), crossed signal paths (crossover paths) at crossover region (150) of the switch (100) can degrade performance balance of the switch (100) and even deteriorate performance of the switch (100) to an unacceptable level.

FIG. 1D shows an exemplary state table representative of operational states of the 4-port monolithic switch (100) of FIG. 1A based on the states of the six distinct switchable conduction paths (112, 123, 134, 141, 113, 124), where the state ON represents connected ports of a switchable conduction path and the state OFF represents disconnected ports of a switchable conduction path. For example, conduction path 123 in an ON state indicates that port2 (102) and port3 (103) are connected by way of a low resistivity path provided by the switchable conduction path 123, and conduction path 123 in an OFF state indicates that port2 (102) and port3 (103) are disconnected by way of a high resistivity path provided by the switchable conduction path 123.

In one exemplary configuration of the switch (100) of FIG. 1A, the switch is designed to support ten unique operational states as represented in the exemplary state table of FIG. 1D, comprising: an all OFF (AO) state, where all conduction paths are in the OFF state; states 1-6, where only one of the conduction paths is ON and the remaining conduction paths are OFF, states 7-8, where two non-adjacent conduction paths at the outer periphery of the switch ((112, 134), (123, 141)) are ON and the remaining conduction paths are OFF; and state 9, where the two traverse (through) conduction paths (113, 124) are ON and the remaining conduction paths are OFF. As used herein, the state 9 can be referred to as a "crossover state" since when in this state, the two conduction paths (113, 124) cross at a crossover region (150) located at the center of the switch (100).

The operational states depicted in FIG. 1D of the monolithic switch (100) of FIG. 1A can be summarized by the following connections:
State AO: all ports are disconnected from one another
State 1: port1 (101) is connected to port2 (102)
State 2: port2 (102) is connected to port3 (103)
State 3: port3 (103) is connected to port4 (104)
State 4: port4 (104) is connected to port1 (101)
State 5: port1 (101) is connected to port3 (103)
State 6: port2 (102) is connected to port4 (104)

State 7: port1 (101) is connected to port2 (102), and port3 (103) is connected to port4 (104)

State 8: port2 (102) is connected to port3 (103), and port4 (104) is connected to port1 (101)

State 9: port1 (101) is connected to port3 (103), and port2 (102) is connected to port4 (104).

Figure 2:
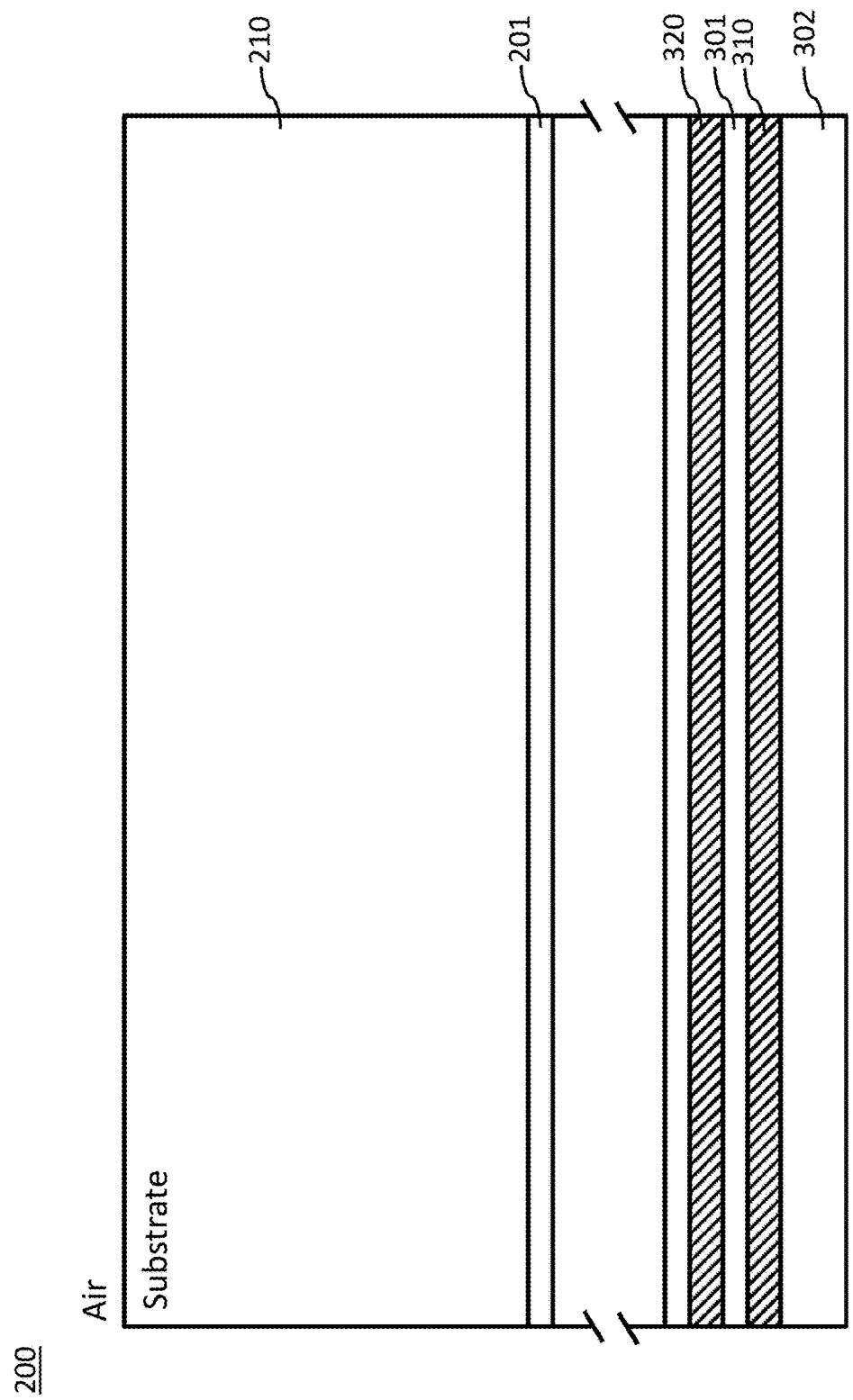
FIG. 2 shows a cross section view of an exemplary substrate having thereupon various layers of insulating and conductive material used to form circuit elements of the monolithic switch of FIG. 1A.

FIG. 2 shows a (flipped) cross section view (200) of an exemplary layered substrate (200) comprising of a substrate (210) having thereupon various layers of insulating material (e.g. 201, 301, 302) and various layers of conductive material (e.g. 310, 320), where such layers can be used to form circuit elements of the monolithic switch (100) of FIG. 1A using manufacturing methods well known to a person skilled in the art. According to some embodiments the substrate (210) can be a sapphire or a high resistivity silicon substrate as known to a person skilled in the art, and in combination with the insulating layer (201) can form a silicon-on-insulator substrate, where additional layers, including layers (301, 302, 310, 320) can be used for formation of the circuit elements. According to some embodiments, the conductive layers can be made of any conductive material, such as various metals known to a person skilled in the art (e.g. copper, aluminum, tungsten, gold, etc.), and the insulating layers can be made of dielectric material, such as, for example, silicon dioxide (SiO2) or silicon nitride (Si3N4). According to some embodiments of the present disclosure, extra layers stacked above the insulating layer (201), such as layers (301, 302, 310, 320), can be added in order to allow any number of layers required to form the circuit elements of the monolithic switch (100) of FIG. 1A, as shown, for example, in FIGS. 3A-3E and 7A-7E later described. As indicated in FIG. 2, according to some embodiments of the present disclosure, the layered substrate (200) can be surrounded by air, as provided, for example, in a case of a flip-chip die layout configuration (e.g. FIG. 17, later described).

According to an embodiment of the present disclosure, coupling between two conduction paths, such as the two switchable paths (113) and (124), at a crossover region, such as the crossover region (150), can be reduced by using narrow transmission lines configured as coplanar waveguides (CPWGs) as conduction paths in the crossover region (150). Such coplanar waveguides are provided by a basic crossover structure (300) according to an embodiment of the present disclosure depicted in FIG. 3A which provides the crossover paths (portions of the switchable paths (113, 124) at the crossover region (150) of the two switchable paths (113) and (124)). As known to a person skilled in the art, coplanar waveguides allow for a controlled characteristic impedance using conduction paths (transmission lines) of lesser width than other RF signal transmission methods suitable for usage in integrated circuits, where such conduction paths are flanked by ground return paths fabricated on a same metal layer as the conduction paths (therefore coplanar), the ground return paths being separated from the conduction paths by a same fixed distance along the length of the conduction path (see FIGS. 3A-3D later described). According to some embodiments of the present disclosure, the width of the conduction paths forming the narrow transmission lines of the coplanar waveguides of the crossover region (150) can be smaller than the width of the transmission lines (TL) of the switchable paths (113, 124) by a factor of 3 or more, while providing a same characteristic impedance across the switchable paths (113, 124). As described later, the narrower width of the transmission lines forming the coplanar waveguides of the crossover region (150) can promote a reduced signal coupling between such transmission lines at a cross section region of the coplanar waveguides.

The crossover paths provided by the basic crossover structure (300) according to the present embodiment are formed with narrow transmission lines (320, 330) designed to reduce the area of the coupling capacitance of the crossover paths. It should be noted that the narrow transmission line (320) is effectively divided into three transmission line segments (320*a*, 320*b*, 320*c*), where the transmission line segment (320*b*) forms the middle segment of the transmission line (320) which crosses the transmission line (330) at a center of the crossover structure (300). As a result, transmission line segments (320*a*, 320*c*) are coplanar with the transmission line segment (330) and form, in conjunction with the adjacent ground returns, coplanar waveguides. The coplanar waveguide structure used in the embodiment (300) according to the present disclosure depicted in FIG. 3A improves cross-talk and isolation while maintaining a desired characteristic impedance (e.g. 50 ohm) of each of the two crossing conduction paths (320, 330). According to an embodiment of the present disclosure, such coplanar waveguide structure (300) may be formed in layers stacked atop the substrate (210) depicted in FIG. 2, such as layers (301, 302, 310, 320). For clarity purposes, only layers of interest are depicted in the various cross section views described below (e.g. FIGS. 3B-3E, 7C-7E and 11B).

Figure 3A:
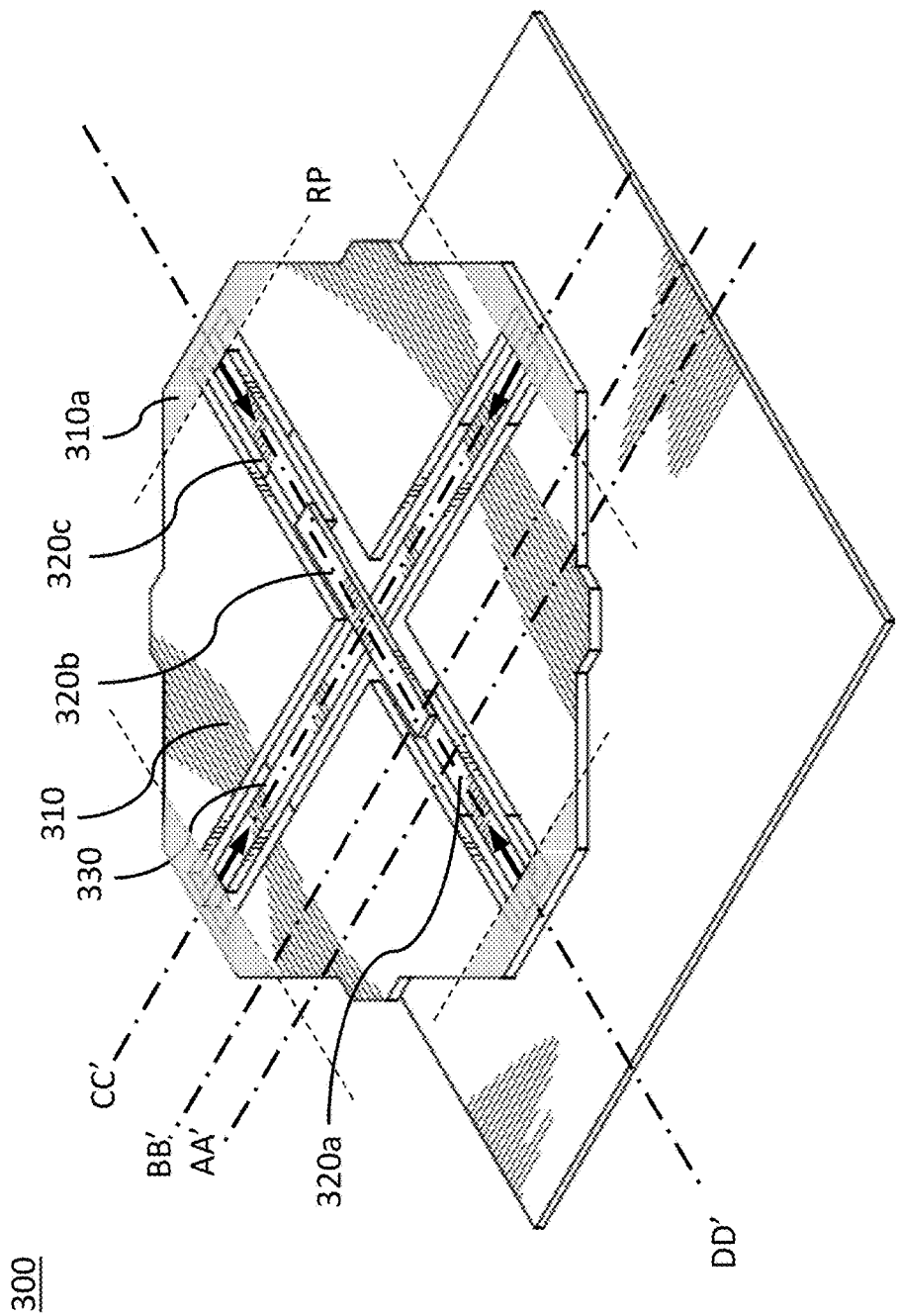
FIG. 3A shows a basic crossover structure according to an embodiment of the present disclosure.

As can be seen in the crossover structure depicted in FIG. 3A, as the conduction paths (320, 330) begin to cross, one path (330) remains on the metal layer (310) while the other path (320) transitions through vias (e.g. 325 of FIG. 3C) to a separate metal layer (containing segment 320*b* of 320) and back to the first metal layer (310) after crossing over the other path (330). In the embodiment according to the present disclosure the crossing paths are separated by a non-conductive material as provided, for example, by the non-conductive layer (301) depicted in FIGS. 3A-3D. Further embodiments according to the present disclosure use a ground shield layer (e.g. 750 of FIG. 7A later described) of different geometries (e.g. FIGS. 15A-15D later described) to separate the crossing paths (320, 330) of the crossover structure (300), the ground shield layer being in contact with the portion of the metal layer (310) surrounding the narrow transmission lines (320, 330) of the waveguides (which in combination form the CPWG structure).

A coplanar waveguide structure for the basic crossover structure (300) according to an embodiment of the present disclosure is shown in FIG. 3B which depicts the cross section view AA' indicated in FIG. 3A. As can be seen in the cross section view AA' of FIG. 3B, the narrow transmission line (320*a*), which is a first segment of the transmission line (320), is formed in the metal layer (310), with same width gaps, created by way of non-conductive areas (303), between the narrow transmission line (320*a*) and the adjacent metal layer (310) along the length of the transmission line. Layers (301, 302) are non-conductive layers that separate the metal layer (310) from other metal layers, such as a metal layer used to fabricate transmission line (320*b*) which serves as a middle segment to the transmission line (320).

FIG. 3C shows the cross section view BB' of the crossover structure (300) indicated in FIG. 3A. As can be seen in the cross section view BB' of FIG. 3C, the middle segment (320*b*) of the transmission line (320) is formed on a separate layer from the metal layer (310), separated by the non-conductive layer (301). Connection to the other segments (320*a*, 320*c*) of the transmission line (320) is made by way of vias (325) as indicated in FIG. 3C.

FIG. 3D shows the cross section view CC' of the crossover structure (300) indicated in FIG. 3A. As can be seen in the cross section view CC' of FIG. 3D, the two transmission lines (320, 330) cross at a center region of the crossover structure (300), separated by the non-conductive layer (301). The two metal connections in the metal layer (310) at the external sides of the two RP lines are optional and are not required to achieve the measured performance of the crossover structure (300). Such connections are included in the high frequency simulation to assure well defined RF reference ports. Such reference ports are shown in FIG. 3A as (4) shaded areas (310a) delimited by a dotted line RP at each of the four ports of the coplanar waveguides. In a case where the reference ports are not desired, the shaded areas (310a) can be removed so as to provide a direct connection to each of the ports of the coplanar waveguides through the metal layer (310). This can result in a discontinuity of the metal layer (310) over the crossover structure (300) that creates four electrically disconnected and separate metal layers (310) (e.g. four quadrants 310 divided by the conduction paths (320, 330). Such electrically disconnected layers are subsequently electrically connected through the ground bumps (1150) discussed with reference to FIG. 11A (later described). Areas corresponding to the optional reference ports are also indicated in FIGS. 3E, 7A, 7D and 7E which will not be further discussed.

Figure 3E:
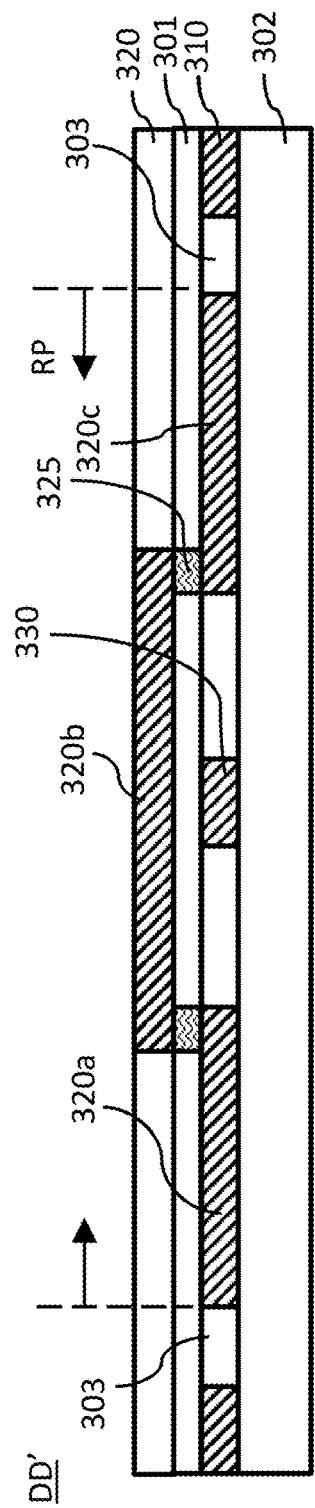

FIG. 3E shows the cross section view DD' of the crossover structure (300) indicated in FIG. 3A. As can be seen in the cross section view DD' of FIG. 3D, segments (320a, 320b, 320c) of the transmission line (320) connect through vias (325), and the two transmission lines (320, 330) cross at a center region of the crossover structure (300), separated by the non-conductive layer (301).

Figure 4:
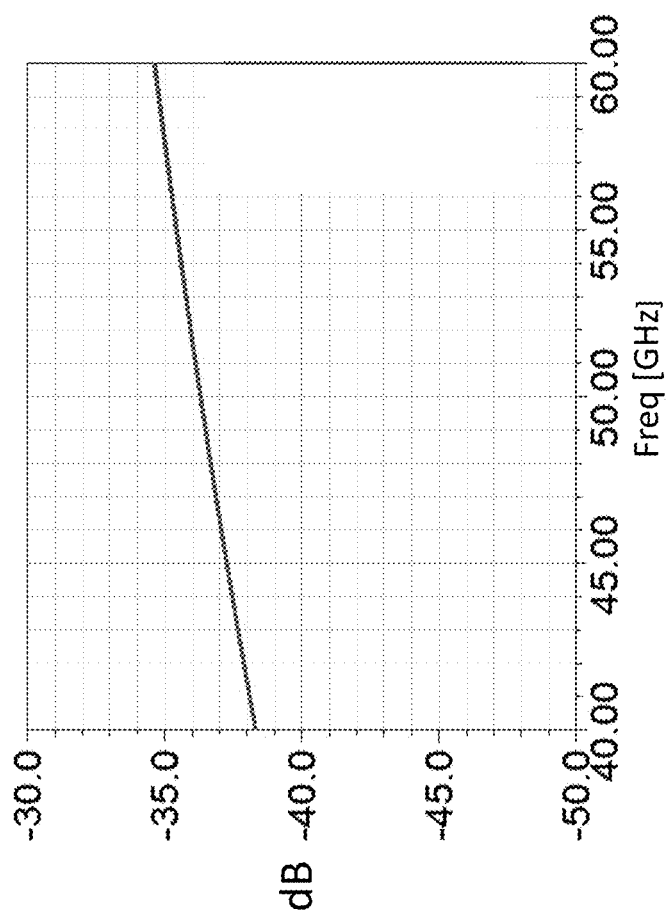
FIG. 4 shows a graph representing simulation results of crossover isolation of the basic crossover structure of FIG. 3A.

FIG. 4 shows a graph representing high frequency simulation results of crossover isolation (isolation between the two signal paths) of the basic crossover structure (300) depicted in FIG. 3A. Such high frequency simulation demonstrates an isolation of −36.3 dB at 50 GHz.

FIG. 5 shows a circuit model representative of the basic crossover structure (300), which comprises a mutual coupling capacitor (530), of capacitance value Cc, coupling a center node (510) of the first signal path (320) to a center node (520) of the second signal path (330). In the circuit model depicted in FIG. 5, each of the signal paths (320, 330) is represented by two transmission lines ((520a, 520b), (530a, 530b)) of a same length (same impedance) coupled to a respective center node (510, 520), where signal nodes (501, 503) indicate the two extremes of the signal path (320), and signal nodes (502, 504) indicate the two extremes of the signal path (330). A lumped element model of the basic crossover structure (300) based on the circuit model of FIG. 5 is depicted in FIG. 6A, where the transmission lines are each represented by a same value impedance, Z, (e.g. 50Ω), and the mutual coupling capacitor (530), is represented by a capacitance value Cc (e.g. 1.9 fF). Accuracy of the lumped element model of FIG. 6A can be verified in the corresponding simulation results (isolation between signal nodes 501-504 of the crossing paths) as plotted and presented in the graph of FIG. 6B, as such graph mimics the simulation results of the crossover isolation of the basic crossover structure depicted in the graph of FIG. 4.

Figure 7A:
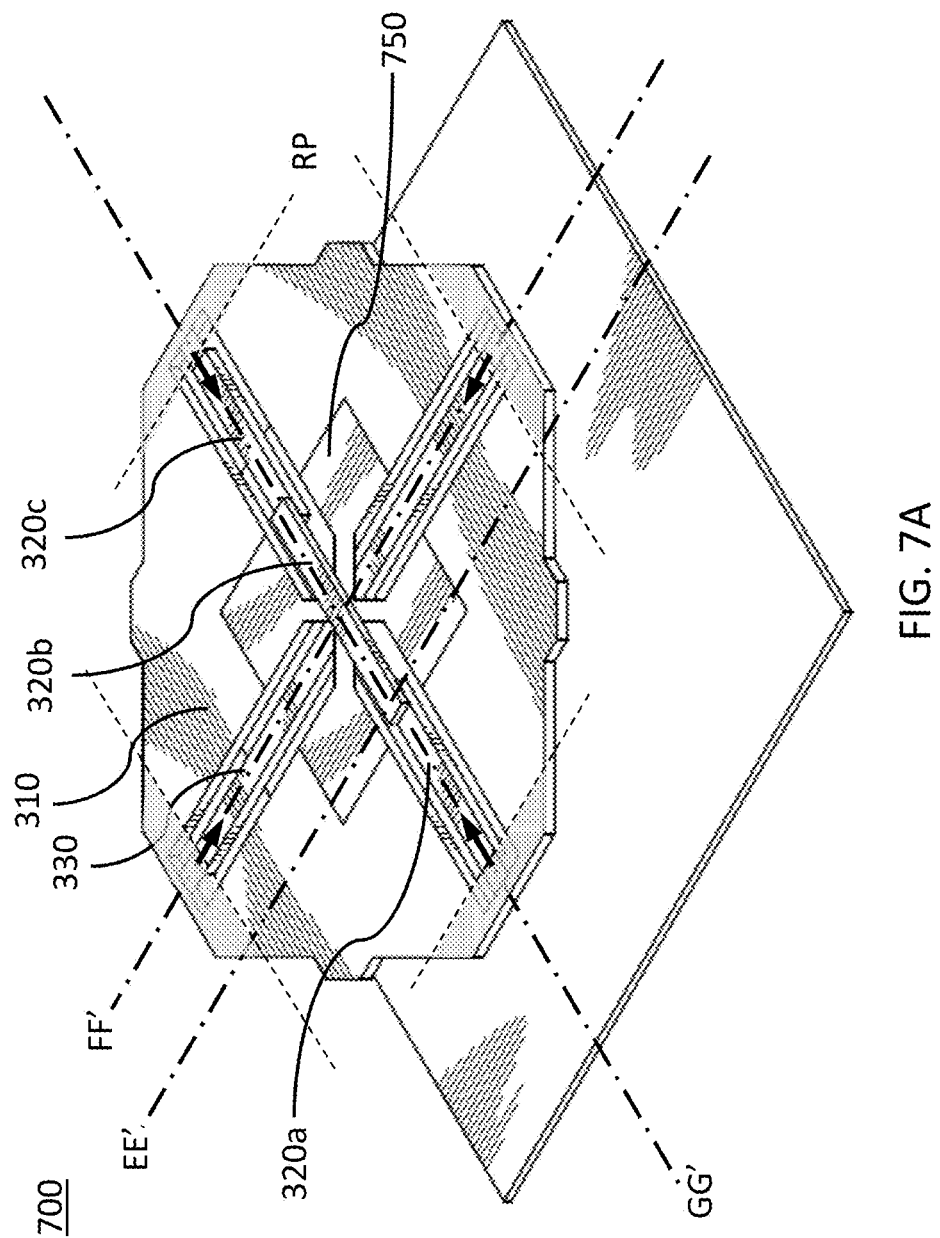
FIG. 7A shows a crossover structure with ground shield according to an embodiment of the present disclosure.
Figure 7B:
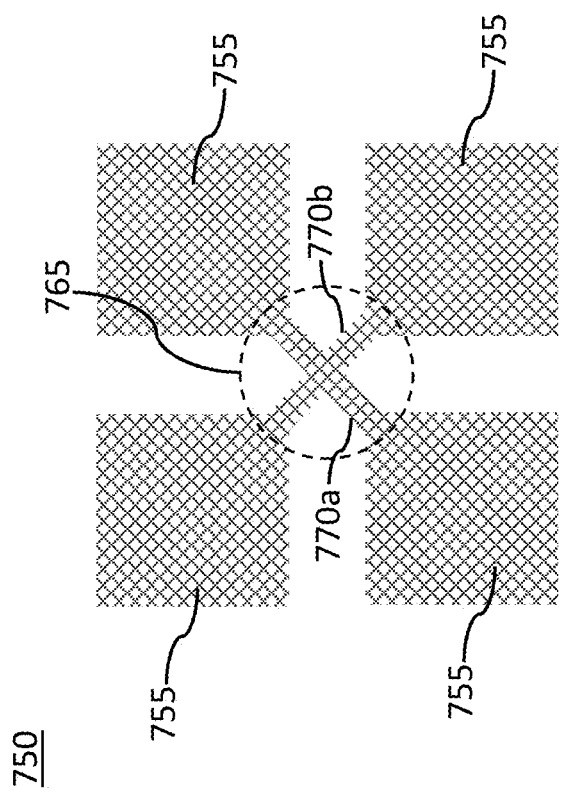
FIG. 7B shows a ground shield according to an embodiment of the present disclosure.

According to a further embodiment of the present disclosure, a performance increase of the basic crossover structure (300) can be provided by inserting a ground shield (750) between the crossing paths (320, 330), as exemplified in the crossover structure (700) of FIG. 7A. The ground shield (750), as further depicted in FIG. 7B, is made of a low loss conductor, similar to the conductor used for the metal layer (310), makes contact, through vias (e.g. 725 of FIG. 7C later described), with the metal layer (310) by way of four substantially equal size square patterns (755) which are joined by way of a center structure (765), the center structure forming a crossed pattern of two lines (770a, 770b) having an exemplary width substantially equal to the width of the narrow transmission lines (320, 330) of the CPWGs, the intersection of the two lines (770a, 770b) forming the crossed pattern and the width of the lines (770a, 770b) defining a physical separation region where the crossing paths are physically separated by the ground shield (as can be seen in the cross section views of FIGS. 7D and 7E, where transmission lines 320, 330 are physically separated by the metal structure 765 formed by the crossing lines 770a and 770b).

FIG. 7C shows the cross section view EE' of the crossover structure (700) indicated in FIG. 7A. When compared to the basic crossover structure (300) of FIG. 3A, the cross over structure (700) comprises two more layers (701, 702); layer (701) being a metal layer within which the ground shield (750) is contained, and layer (702) being a non-conductive layer, similar to layers (301, 302), used to isolate metal layer (701) from metal layer (310) and from the top metal layer containing the middle segment (320b) of the transmission line (320). As can be seen in the cross section view EE' of FIG. 7C, electrical connection between the ground shield (750) and the metal layer (310) is made through vias (725) that make electrical contact with the square patterns (755) of the ground shield (750). A person skilled in the art would understand that the blank areas in the cross section views represent non-conductive material and the hatched areas represent conductive material. The person skilled in the art would know of various fabrication methods for fabricating the structures depicted in the various cross section views of the present disclosure, including creating metal structures within non-conductive layers, and creating non-conductive regions within conductive layers. Similarly to the basic crossover structure (300), transmission line segments (320a, 320c) are electrically connected to the transmission line segment (320b) by way of vias, as indicated by structure (325) of FIG. 7C.

FIG. 7D shows the cross section view FF' of the crossover structure (700) indicated in FIG. 7A. As can be seen in the cross section view FF' of FIG. 7D, the two transmission lines (320, 330) cross at a center region of the crossover structure (700), separated by the structure (765) of the ground shield (750). Assuming an exemplary equal width (substantially equal) $w_e$ of the crossing lines (770a, 770b) of the structure (765) and the transmission lines (320, 330), and a 45 degrees rotation angle between the lines (770a, 770b) of the structure (765) and the crossing transmission lines (320, 330), the width of the structure (765) of the cross section view FF' of FIG. 7D is equal to $2^{1/2}$ times the width $W_e$.

Figure 7E:
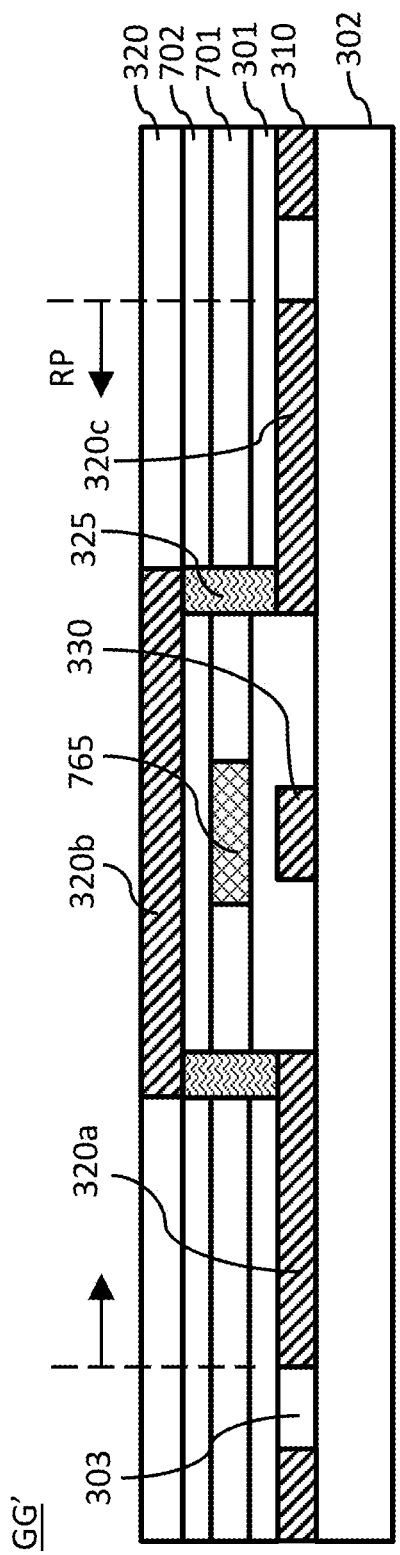

FIG. 7E shows the cross section view GG' of the crossover structure (700) indicated in FIG. 7A. As can be seen in the cross section view GG' of FIG. 7D, segments (320a, 320b, 320c) of the transmission line (320) connect through vias (325), and the two transmission lines (320, 330) cross at a center region of the crossover structure (300), separated by the structure (765) of the ground shield (750) as discussed in relation to FIG. 7D.

Figure 8:
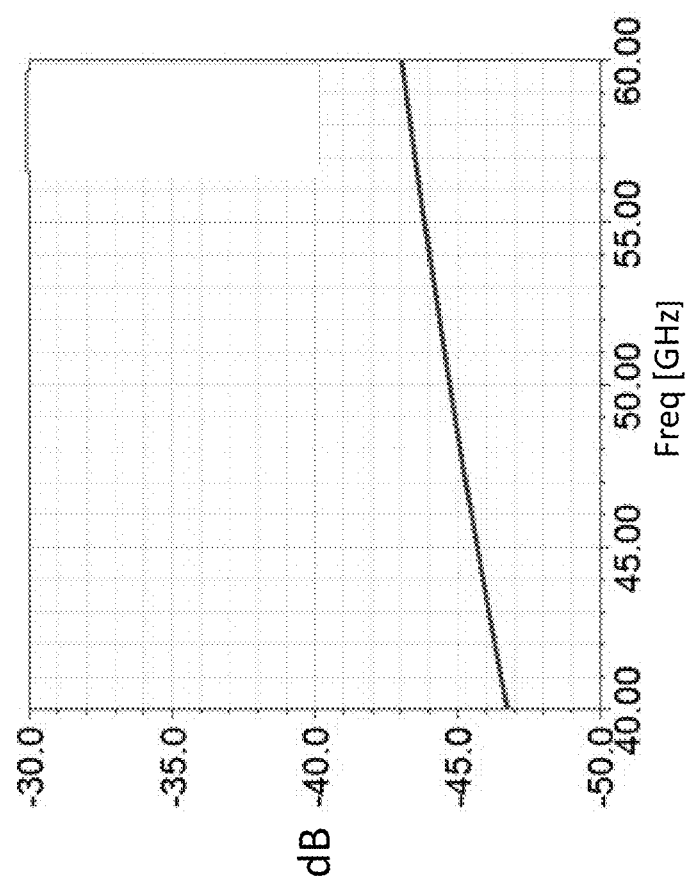
FIG. 8 shows a graph representing simulation results of crossover isolation of the crossover structure with ground shield of FIG. 7A.

FIG. 8 shows a graph representing high frequency simulation results of crossover isolation (isolation between the two signal paths) of the crossover structure (700) depicted in FIG. 7A. Such high frequency simulation demonstrates an isolation of −44.7 dB at 50 GHz, which represents a performance increase of about 44.7−36.3=8.4 dB when compared to the basic crossover structure (300) of FIG. 3A.

Figure 9:
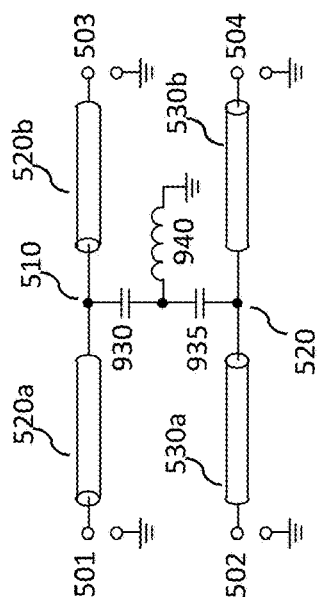
FIG. 9 shows a circuit model representative of the crossover structure with ground shield of FIG. 7A.

FIG. 9 shows a circuit model representative of the crossover structure (700), which comprises capacitors (930, 935), of capacitance value (Csg1, Csg2), and an inductor (940) of inductance value Lg. Similar to the circuit model depicted in FIG. 5, in the circuit model depicted in FIG. 9, each of the signal paths (320, 330) is represented by two transmission lines ((520a, 520b), (530a, 530b)) of a same length (same impedance) coupled to a respective center node (510, 520), where signal nodes (501, 503) indicate the two extremes of the signal path (320), and signal nodes (502, 504) indicate the two extremes of the signal path (330). Capacitor (930) is coupled between the center node (510) of the first signal path and a first terminal of the inductor (940), and capacitor (935) is coupled between a center node (520) of the second signal path and the first terminal of the inductor (940). A second node of the inductor (940) is connected to ground. Capacitors (930) and (935) of the circuit model depicted in FIG. 9 represent capacitive coupling of the two crossing paths (320, 330) to the ground shield (750), and the inductor (940) represents an inductive path through a planar ground area created by the geometry of the ground shield (750) and a system ground. A person skilled in the art will realize that an inductance value of the inductor (940) can be a function of the geometry of the ground shield (750), and an electrical distance (conductance path) between such ground shield and the system ground. Effects of varying the geometry of the ground shield (750) and the electrical distance to the ground system over the value of the inductance Lg of the inductor (940) is discussed in later paragraphs of the present disclosure (e.g. as related to FIGS. 15A-15D later described).

Figure 10B:
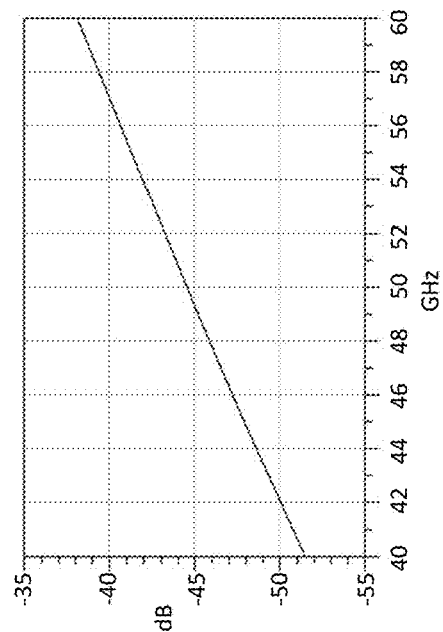
FIG. 10B shows a graph representing simulation results of the impact of capacitive and inductive coupling in the lumped element model of FIG. 10A.
Figure 10A:
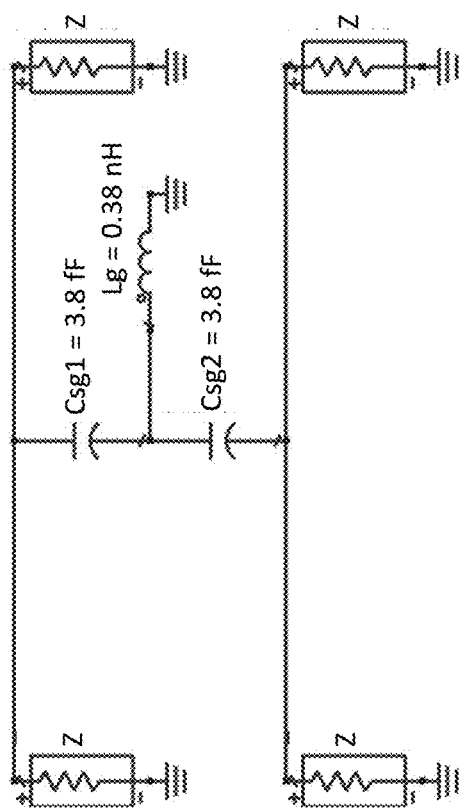
FIG. 10A shows a lumped element model of the crossover structure with ground shield of FIG. 7A based on the circuit model of FIG. 9.

A lumped element model of the crossover structure (700) based on the circuit model of FIG. 9 is depicted in FIG. 10A, where the transmission lines and port loading impedance are each represented by a same value impedance, Z, (e.g. 50Ω), the coupling capacitors (930) and (935) are each represented by a respective capacitance value Cgs1 and Cgs2 (e.g. of a same value 3.8 fF), and the inductor (940) is represented by an inductance value Lg (e.g. 0.38 nH). Accuracy of the lumped element model of FIG. 10A can be verified in the corresponding simulation results (isolation between signal nodes 501-504 of the crossing paths) as plotted and presented in the graph of FIG. 10B, as such graph mimics the simulation results of the crossover isolation of the crossover structure depicted in the graph of FIG. 8.

Figure 11A:
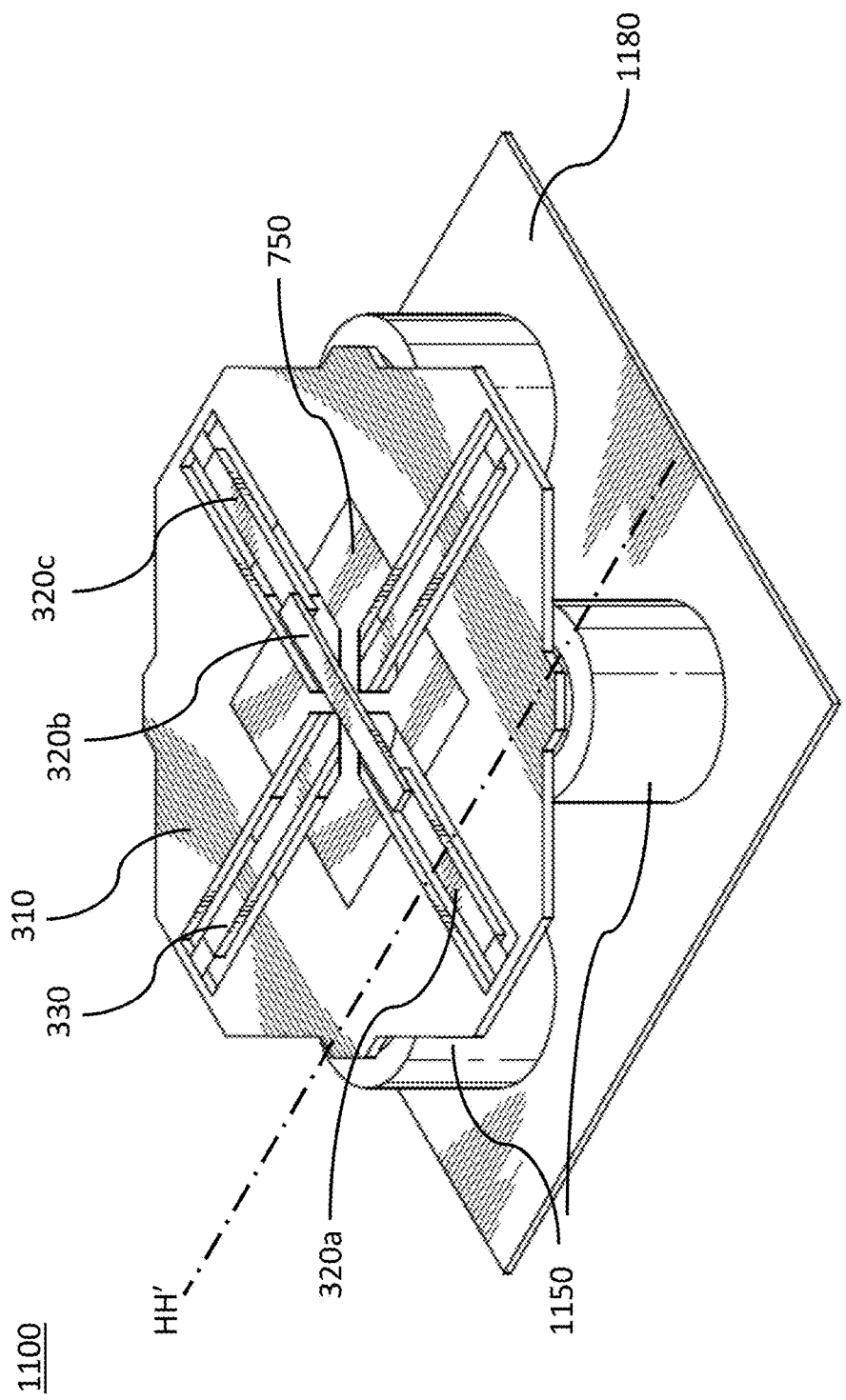
FIG. 11A shows a crossover structure with ground shield and local ground bumps according to an embodiment of the present disclosure.

According to a further embodiment of the present disclosure, a performance increase of the crossover structure (700) can be provided by adding local ground bumps (1150) to the crossover structure, as depicted in the crossover structure (1100) of FIG. 11A. The ground bumps (1150), made of a low loss conductor, similar to the conductor used for the metal layer (310), make contact with the metal layer (310) at one side of the ground bumps (1150), and make contact to a system ground layer (1180) at the other side of the ground bumps (1150). A person skilled in the art will understand that such electrical contact between the ground bumps (1150) and the metal layer (310) can be made by way of vias created through layers within which the crossover structure (1100) is created. In addition, according to one exemplary embodiment, the ground bumps (1150) can each be placed at a same distance with respect to the center of the crossover structure (1150) and at equidistant radial positions in the plane of the metal layer (310), as suggested in FIG. 11A.

Figure 11B:
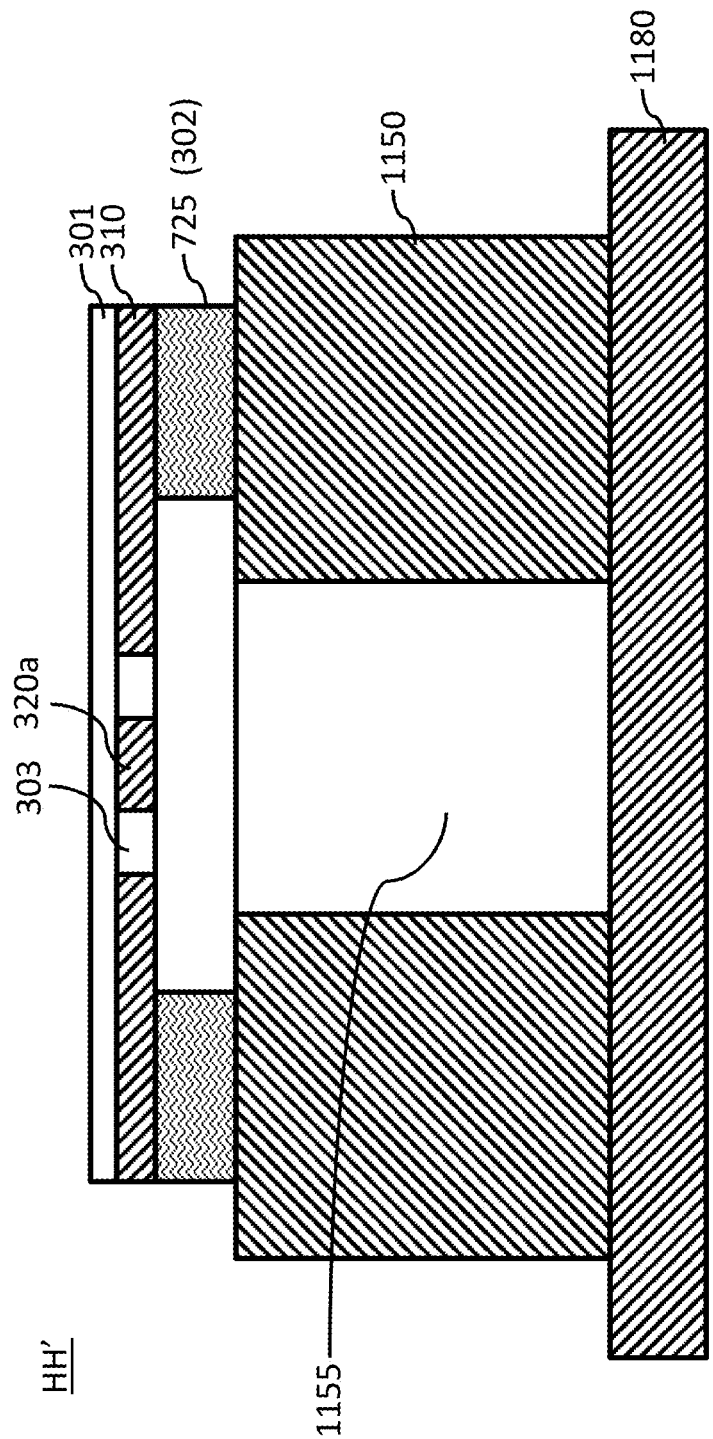
FIG. 11B shows the cross section view HH' indicated in FIG. 11A

FIG. 11B shows the cross section view HH' of the crossover structure (1100) indicated in FIG. 11A. As can be seen in the cross section view HH' of FIG. 11B, ground bumps (1150) are an electrically connected, on a top side, to the metal layer (310) through vias (725) created within the non-conductive layer (302), and are electrically connected, on a bottom side, to the system ground layer (1180) through direct contact. It should be noted that the dimensions of the ground bumps (1150) indicated in the cross section view of FIG. 11B relative to other structures of the cross sections view are merely for clarity purposes. A person skilled in the art will realize that the region (1155) depicted in FIG. 11B is commonly an air region corresponding to gap regions between the ground bumps (1150), the system ground layer (1180) and the non-conductive layer (302). As known to a person skilled in the art, the region (1155) can comprise any material with a highly insulating characteristic so as to minimize signal loss. In some applications, it may be desirable for the region (1155) to have a low dielectric constant so as to minimize a parasitic capacitance formed in such region.

Figure 12:
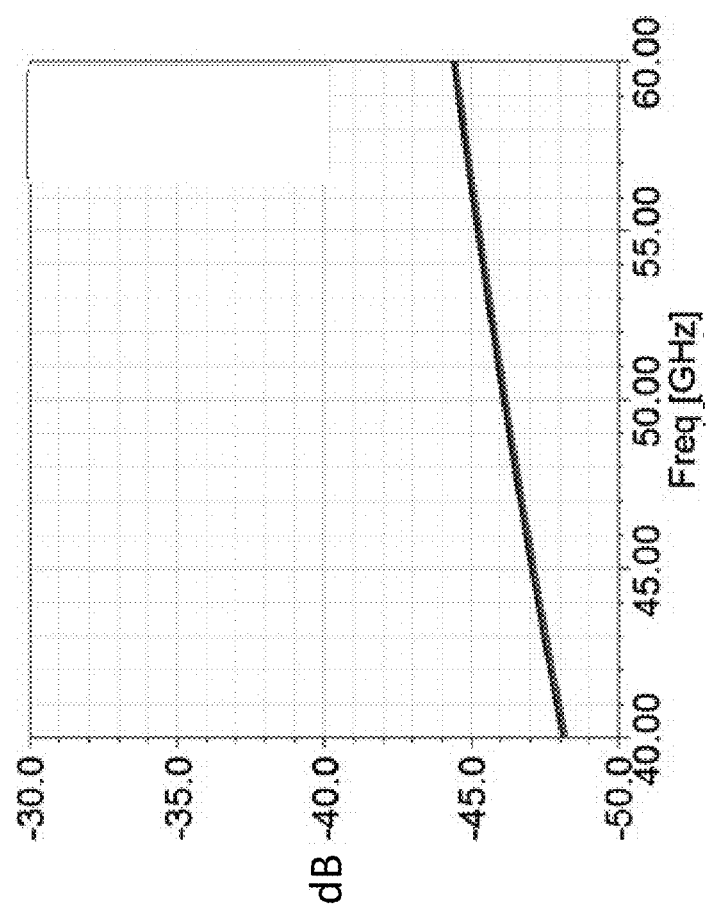
FIG. 12 shows a graph representing simulation results of crossover isolation of the crossover structure with ground shield and local ground bumps of FIG. 11A.

FIG. 12 shows a graph representing high frequency simulation results of crossover isolation of the crossover structure (1100) depicted in FIG. 11A. Such high frequency simulation demonstrates an isolation of −46.0 dB at 50 GHz, which represents a performance increase of about 1.3 dB when compared to the crossover structure (700) of FIG. 7A.

Figure 13:
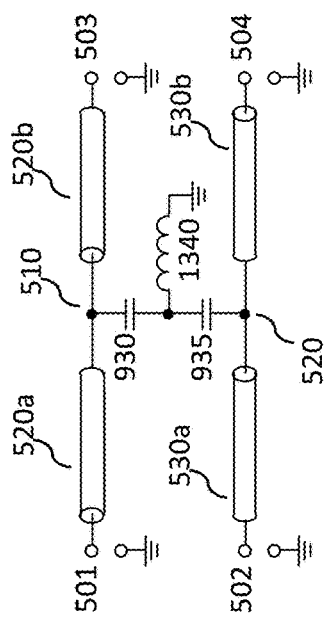
FIG. 13 shows a circuit model representative of the crossover structure with ground shield and local ground bumps of FIG. 11A.

FIG. 13 shows a circuit model representative of the crossover structure (1100), which comprises capacitors (930, 935), of capacitance value (Csg1, Csg2), and an inductor (1340) of inductance value Lv. The circuit model of FIG. 13 is based on the circuit model depicted in FIG. 9, and like reference designators refer to like elements of the models describes with reference to FIG. 9. Capacitors (930) and (935) of the circuit model depicted in FIG. 13 represent capacitive coupling of the two crossing paths (320, 330) to the ground shield (750), and the inductor (1340), of inductance value Lv, represents an inductive path through a planar ground area created by the geometry of the ground shield (750) and a system ground, the inductive path passing through the ground bumps (1150). A person skilled in the art knows that an inductance value Lv of the inductor (1340) can be a function of the geometry of the ground shield, and an electrical distance (conductance path) between such ground shield and the system ground (1180). As the ground bumps (1150) reduce the electrical distance between the ground shield (750) and the system ground (1180), also known as return inductance, the inductance value Lv of the inductor (1340) is expected to be less than the inductance value Lg of the inductor (940) associated to the crossover structure (700) discussed above.

Figure 14B:
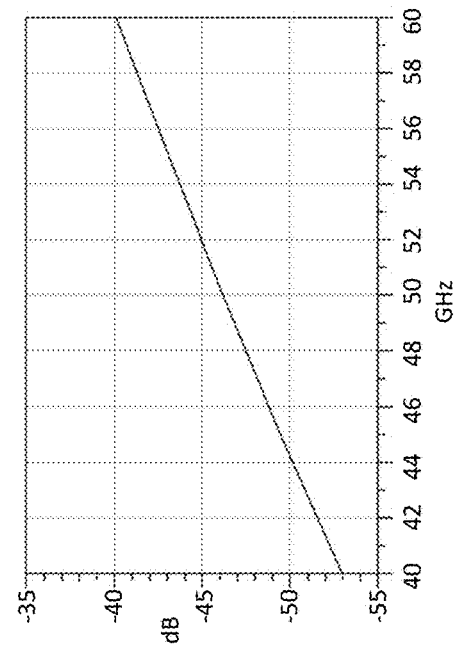
FIG. 14B shows a graph representing simulation results of the impact of capacitive and inductive coupling in the lumped element model of FIG. 14A.
Figure 14A:
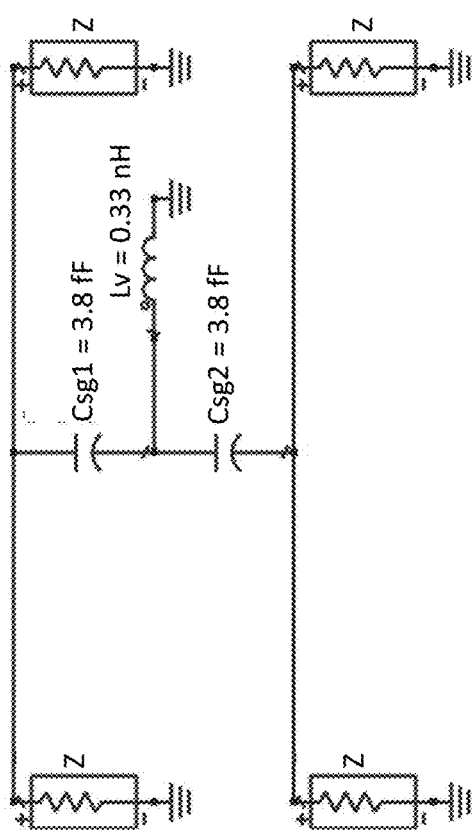
FIG. 14A shows a lumped element model of the crossover structure with ground shield and local ground bumps of FIG. 11A based on the circuit model of FIG. 13.

A lumped element model of the crossover structure (1100) based on the circuit model of FIG. 13 is depicted in FIG. 14A, where the transmission lines are each represented by a same value impedance, Z, (e.g. 50Ω), the coupling capacitors (930) and (935) are each represented by a respective capacitance value Csg1 and Csg2 (e.g. of a same value 3.8 fF), and the inductor (1340) is represented by an inductance value Lv (e.g. 0.33 nH (versus 0.38 nH for Lg). Accuracy of the lumped element model of FIG. 14A can be verified in the corresponding simulation results (isolation between signal nodes 501-504 of the crossing paths) as plotted and presented in the graph of FIG. 14B, as such graph mimics the simulation results of the crossover isolation of the crossover structure depicted in the graph of FIG. 12.

Based on the above analysis of the structures (300), (700) and (1100) respectively depicted in FIGS. 3A, 7A and 11A (and associated cross section views), a gradual improvement in isolation is observed; first by the introduction of the ground shield (750), where an improvement of 8.4 dB is obtained due to the reduced crossover coupling provided by the ground shield (750), and second, by the introduction of the ground bumps (1150), where an improvement of 1.3 dB is obtained due to a lowered return inductance. A net improvement of approximately 10 dB at 50 GHz when comparing the structure (1100) to the basic structure (300) can be observed.

As discussed above, the geometry of the ground shield (750) of the exemplary embodiments according to the present disclosure depicted in FIGS. 7A and 11A can affect the amount of reduction in the crossover coupling of the corresponding crossover structures. FIGS. 15A-15D depict top views of exemplary embodiments of the present disclosure of the crossover structure (1100) with different ground shield (750) geometries. The crossover structure (1500A) has a ground shield (750A) with same geometry as the geometry of the ground shield (750) of FIG. 7B. The crossover structure (1500B) has a ground shield (750B) with a substantially same geometry as the geometry of the ground shield (750) of FIG. 7B, with the difference that the width of the lines forming the crossed pattern of the center structure (765B) of the crossover structure (1500B) is half (½X) the width of the lines (770a, 770b) forming the crossed pattern of the center structure (765) of the ground shield (750) and therefore provide a lesser size physical separation region as compared to the physical separation region provided by the ground shield (750). The crossover structure (1500C) has a ground shield (750C) with a substantially same geometry as the geometry of the ground shield (750) of FIG. 7B, with the difference of the width of the lines forming the crossed pattern of the center region (765C) of the crossover structure (1500C) is twice (2X) the width of the lines forming the crossed pattern of the center region (765) of the ground shield (750) and therefore provide a larger size physical separation region as compared to the physical separation region provided by the ground shield (750). Finally, the crossover structure (1500D) has a ground shield (750D) which is substantially a square pattern encompassing the entire ground shield (750) of FIG. 7B separating the transmission lines (320, 330) throughout a square region encompassing the entire segment (320b) of the transmission line (320).

FIGS. 16A-16D respectively show graphs representing high frequency simulation results of the crossover structures 15A-15D. Such high frequency simulation demonstrates that better crossover isolation of the crossover structures can be obtained as a function of a larger physical separation region between the crossing paths provided by the ground shield (750A-750D). Accordingly, ground shields 750B, 750A, 750C and 750D respectively provide, at a frequency of 50 GHz, an isolation of −44 dB, −46 dB, −48.8 dB and −55.5 dB of the crossover paths of the corresponding crossover structures.

It should be noted that although the simulation results with respect to FIGS. 16A-16D promote a larger physical separation region provided by corresponding ground shields (750A-750D), when used in a larger system as a means to provide isolation between crossed signal paths, a crossover structure (e.g. 1500D of FIG. 15D) with such larger physical separation region may not necessarily provide a best overall isolation performance of the larger system. For example, the inventors have used the crossover structures (15A-15D) in the switch (100) of FIG. 1A with the above discussed operational states depicted in FIG. 1D and found that optimum switch performance (isolation, insertion loss) is obtained using the crossover structure (1500A) of FIG. 15A, followed by, in order from better to worse, the crossover structures 1500B, 1500C and 1500D. This leads to the conclusion that although a contribution of the crossover structure must be factored into the overall design of the larger system (switch 100), ultimate performance of the larger system may be dominantly influenced by characteristics of other (active, passive) components, such as the transistors (S3, S4) of the switch (100) and the total length of the switchable paths (112, 123, 134, 141, 124, 113). The increased performance of the cross over structure according to the present disclosure (e.g. 1500D) is expected to be leveraged as device level performance (e.g. S3, S4) improves with future CMOS generations.

Figure 17:
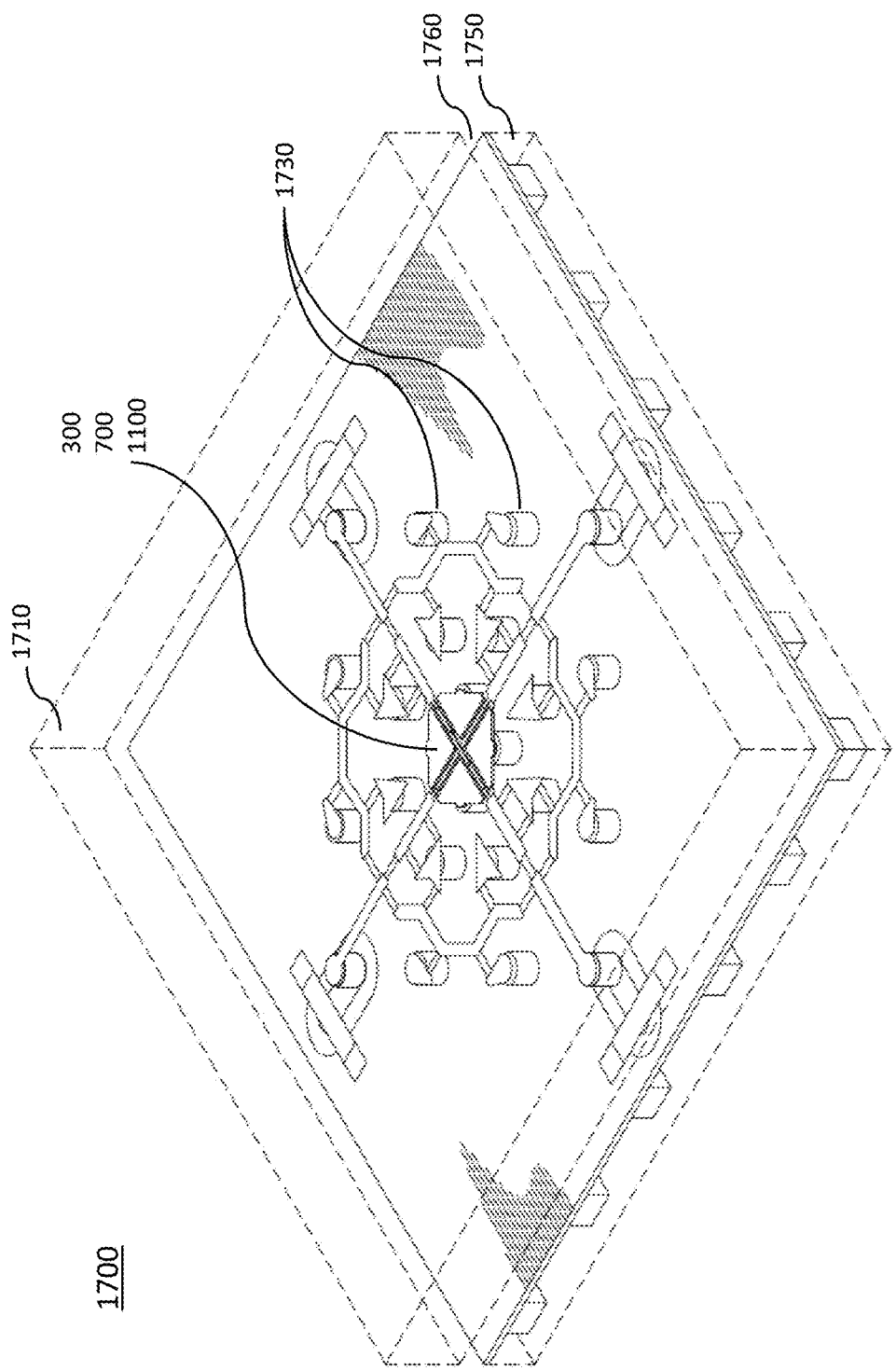
FIG. 17 shows an exemplary die layout of the switch of FIGS. 1-2 fitted with a crossover structure according to the present disclosure.

FIG. 17 shows a flip-chip die layout configuration (1700) of the switch (100) of FIG. 1A fitted with a crossover structure (e.g. 300, 700, 1100, 1500A-1500D) according to the various embodiments of the present disclosure discussed above. The series/shunt distributed architecture coupled with the symmetrical layout of the flip-chip die layout configuration (1700) is critical to achieving equal RF performance of each of the operating states of the switch. Also critical to the performance of the switch is the routing of the signal conduction paths, where a combination of wider transmission lines and narrower transmission lines are used in a same metal layer of the switch, the narrower transmission lines being used in the crossover structure at the center region of the switch. According to an exemplary embodiment of the present disclosure, the flip-chip die layout configuration (1700) is fabricated using a silicon-on-insulator (SOI) technology on a sapphire substrate (1710). Conductive bumps (1730) are used to electrically connect the flip-chip (1700) to a base layer (1750). According to an exemplary embodiment, the base layer (1750) can be a semiconductor such as, for example, alumina, and can be covered by a conductive layer (e.g. gold) in a region underlying the flip-chip (1700). As can be seen in FIG. 17, the height of the bumps (1730) creates a gap (1760) between the surfaces of the flip-chip (1700) and the base layer (1750). According to an exemplary embodiment such gap (1760) can be filled with air. Although such fabrication technology can provide benefits due to its inherent isolation attributes, usage of such exemplary fabrication technology should not be seen as limiting the scope of what the inventors consider their invention.

Figure 18:
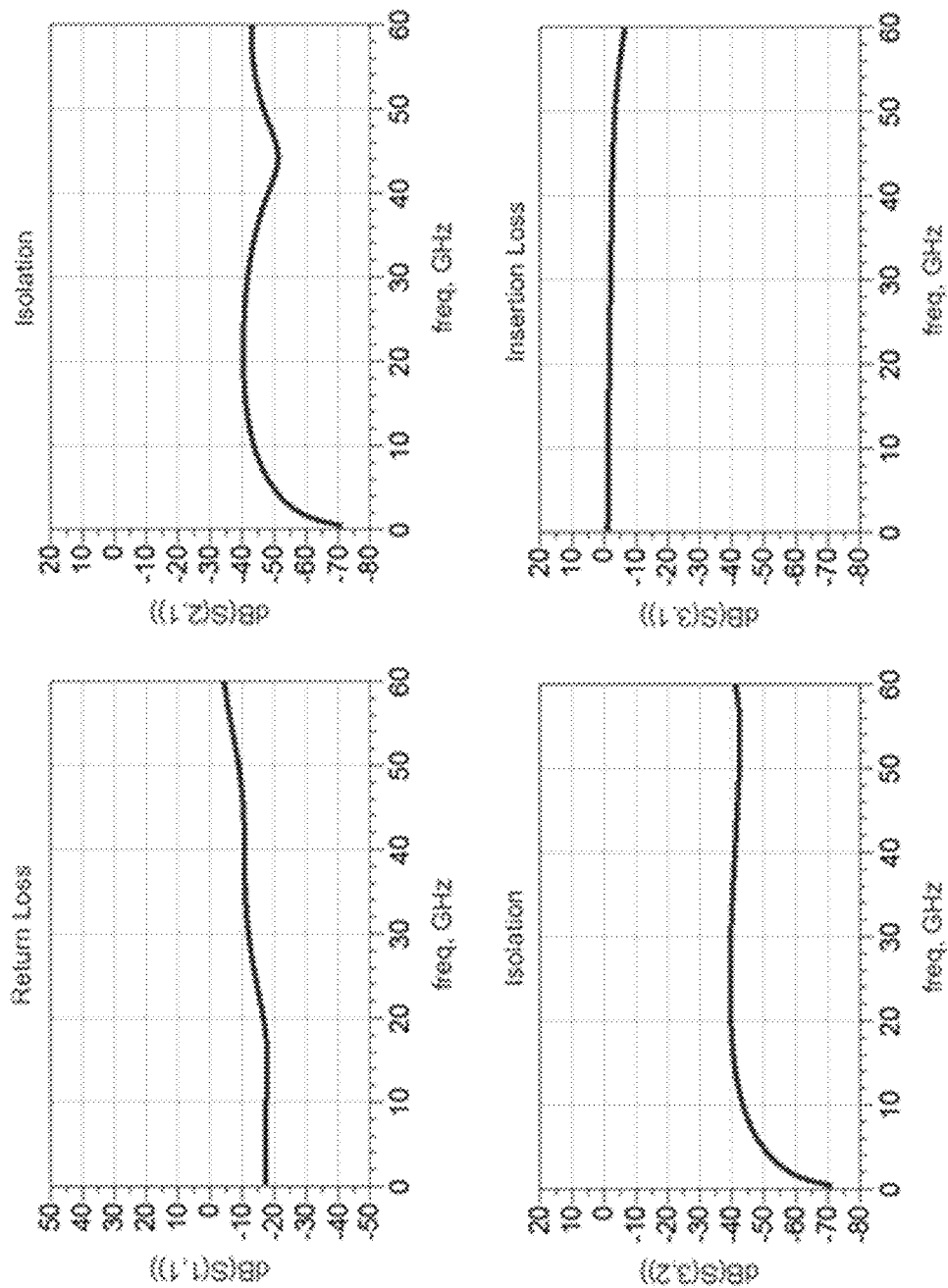
FIG. 18 shows graphs representing simulated results on performance of the switch of FIG. 17 while the switch is in a crossover state.
Figure 19:
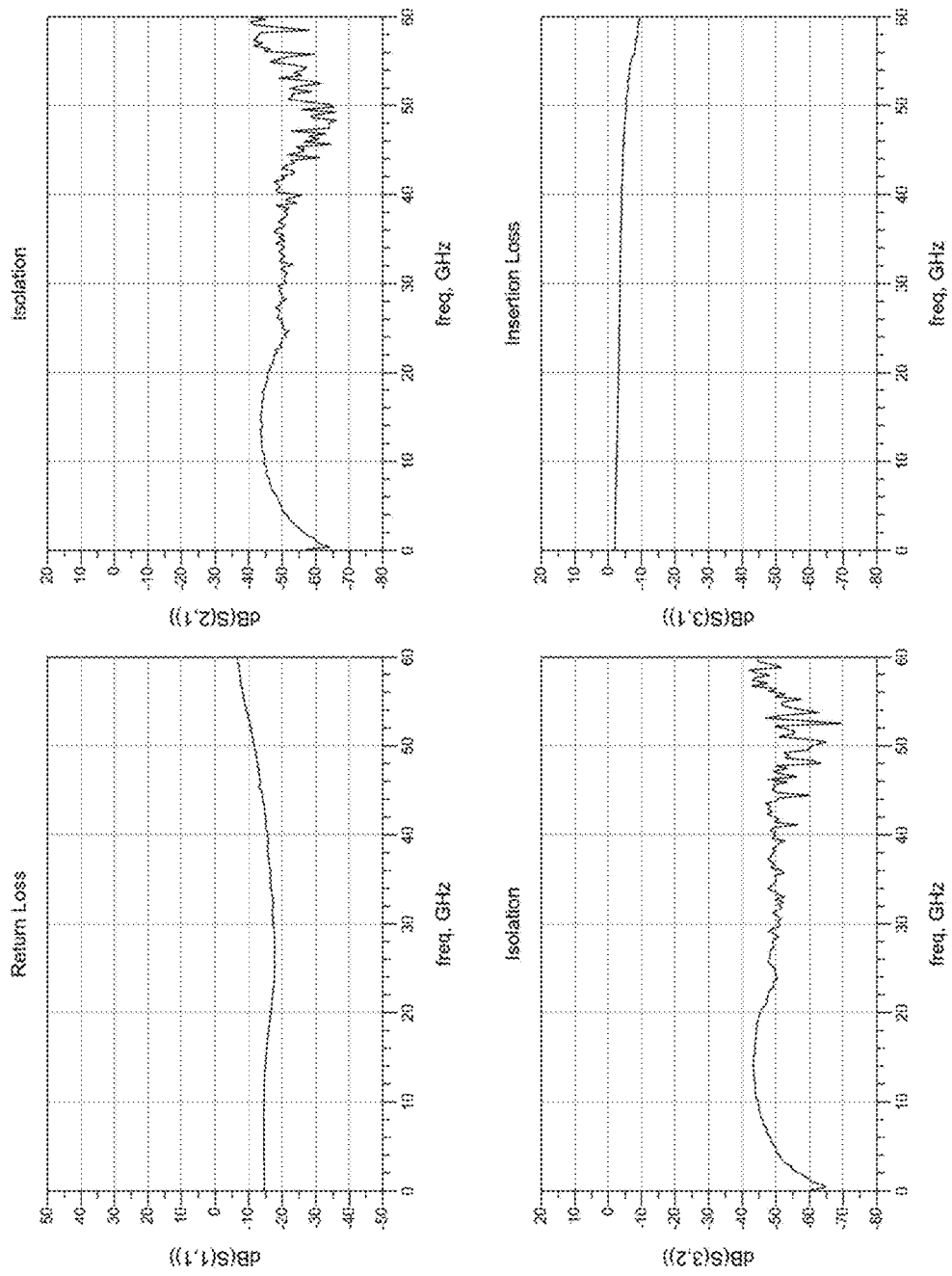
FIG. 19 shows graphs representing measured results on performance of the switch of FIG. 17 while the switch is in the crossover state.
Figure 20:
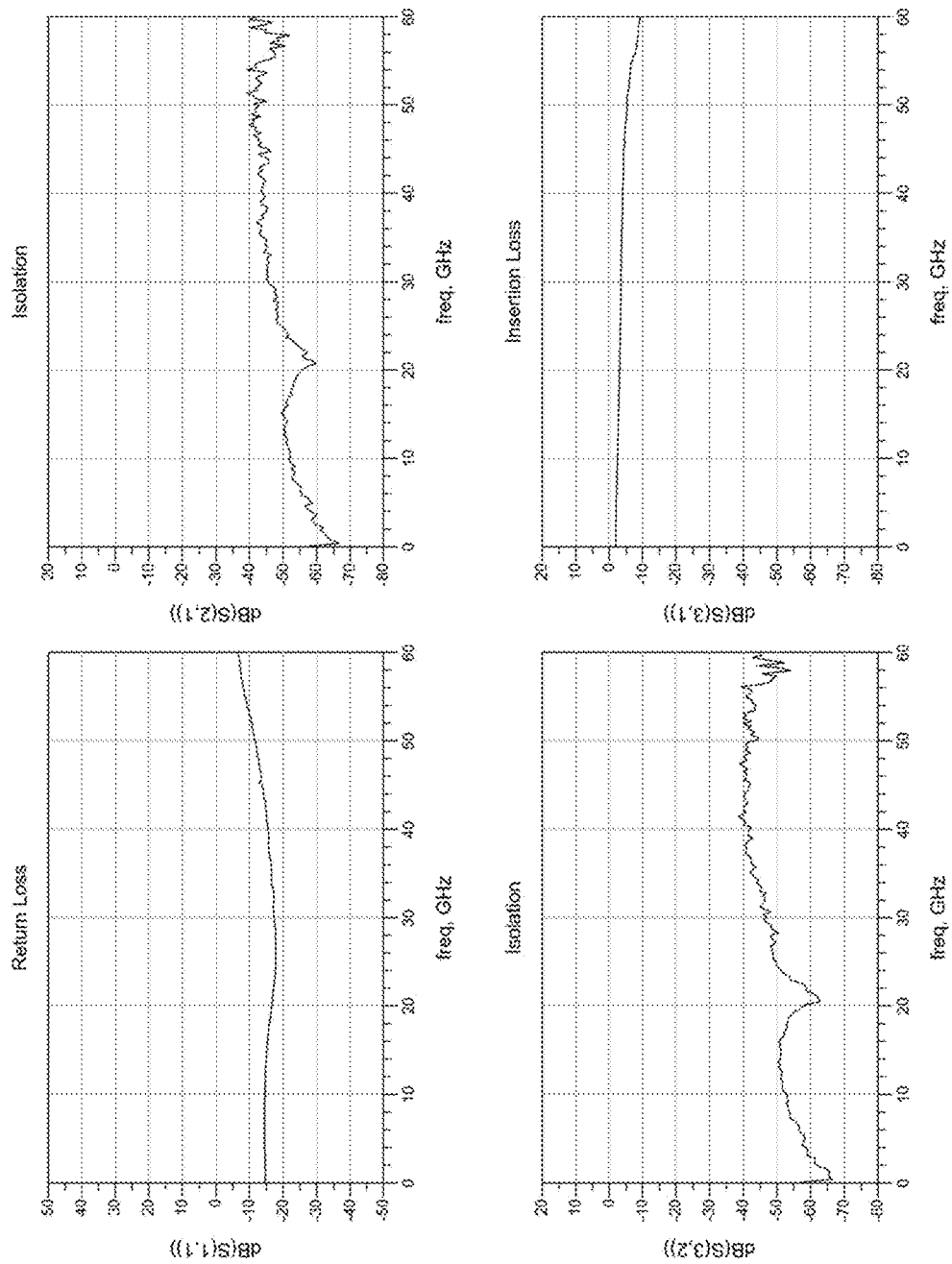
FIG. 20 shows graphs representing measured results on performance with respect to ports 1-3 of the switch of FIG. 17 while the switch operates in the state 5 of the state table depicted in FIG. 2.

FIGS. 18-20 show data graphs representative of a performance of the flip-chip die layout configuration (1700) of the switch (100) depicted in FIG. 17, as measured by a return loss, isolation and insertion loss of the various ports (port1-port4) of the switch when the switch is operating at a given operational state of the six unique operational states (described above), where y-axis of the data plots represents a measured value in dB between two ports, as indicated by the corresponding label, "dB(S($p_1$, $p_2$))", $p_1$ and $p_2$ being one of the ports (port1-port4) of the switch.

FIG. 18 show data graphs representing simulated performance data of the switch (100) fabricated according to the flip-chip layout configuration (1700) when the switch is in the state 9 (port1 is connected to port 2). Such simulated performance data indicate that an isolation of −40 dB (e.g. between port1 and port2) can be achieved across a usable bandwidth.

FIG. 19 show data graphs representing measured performance data of the switch (100) fabricated according to the flip-chip layout configuration (1700) when the switch is in the state 9. Such measured performance data are in agreement with the simulated performance data represented in FIG. 18.

Figure 21:
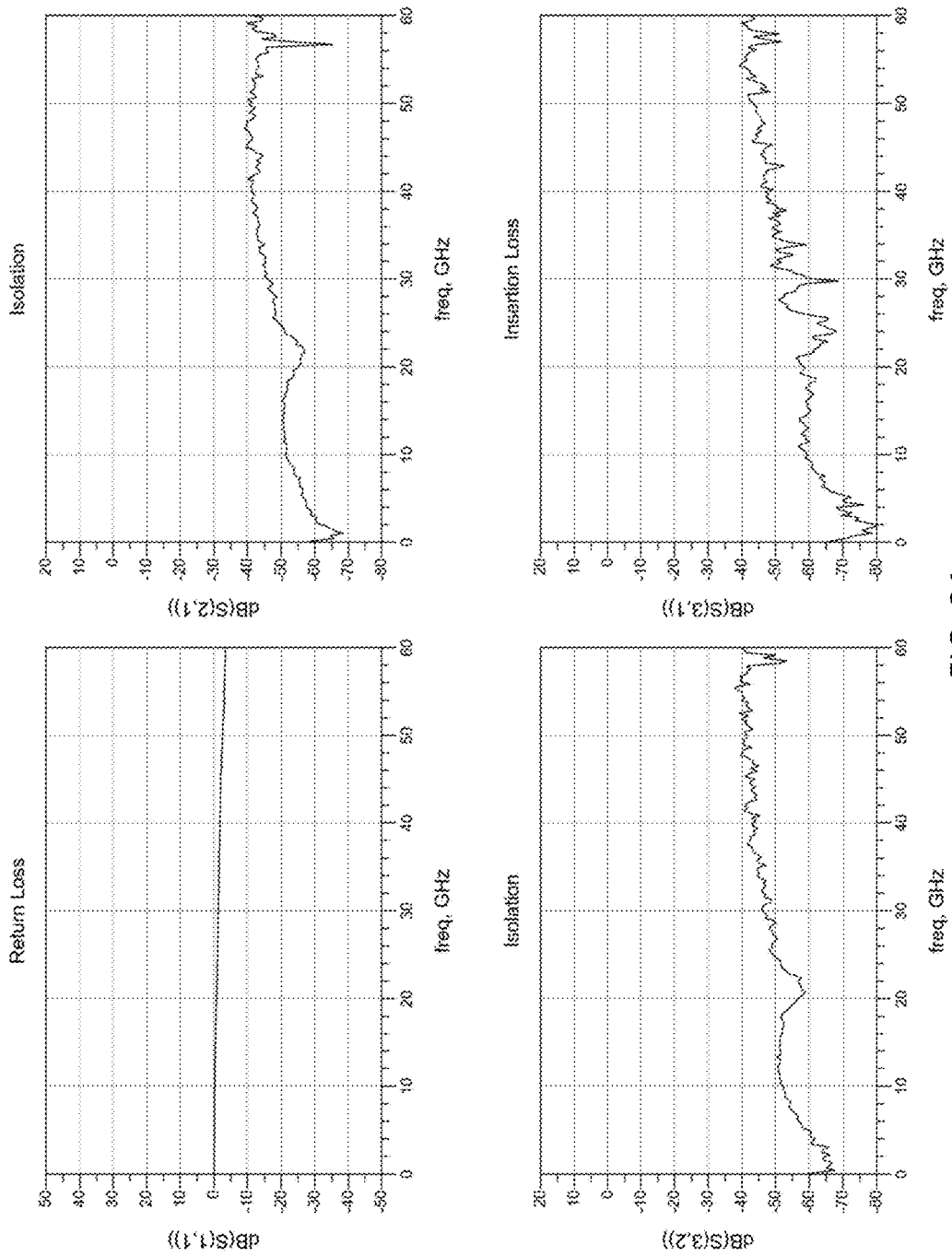
FIG. 21 shows graphs representing measured results on performance with respect to ports 1-3 of the switch of FIG. 17 while the switch operates in the state 6 of the state table depicted in FIG. 2.

FIG. 20 and FIG. 21 respectively show data graphs representing measured performance data of the switch (100) fabricated according to the flip-chip layout configuration (1700) when the switch is in the state 5 and the state 6, with respect to the same ports (port1, port2, port3). Such measured performance data allow deducing the effect of the cross coupling of the signal paths when the switch is in the state 9 by driving each of the crossover states 5 and 6 independently (as state 9 can be considered as state 5 and state 6 combined). As can be seen by the data graphs of FIGS. 19-21, the insertion loss and isolation performance are not compromised by the cross coupling of the signal paths provided in the state 9.

Exemplary and non-limiting applications for larger systems using the crossover structures according to the various embodiments of the present disclosure can include general analog circuits, RF switches, power amplifiers (PAs), low noise amplifiers (LNAs), analog to digital converters (ADCs), voltage controlled oscillators (VCOs), and voltage reference circuits at frequencies ranging from DC to 100 GHz and beyond. In general, the crossover structures according to the teachings of the present disclosure can be generated using any multiple layer fabrication technology.

Applications that may include the novel apparatus and systems of various embodiments include electronic circuitry used in high-speed computers, communication and signal processing circuitry, modems, single or multi-processor modules, single or multiple embedded processors, data switches, and application-specific modules, including multilayer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., mp3 players), vehicles, medical devices (e.g., heart monitor, blood pressure monitor, etc.) and others. Some embodiments may include a number of methods.

It may be possible to execute the activities described herein in an order other than the order described. Various activities described with respect to the methods identified herein can be executed in repetitive, serial, or parallel fashion.

The accompanying drawings that form a part hereof show, by way of illustration and not of limitation, specific embodiments in which the subject matter may be practiced. The embodiments illustrated are described in sufficient detail to enable those skilled in the art to practice the teachings disclosed herein. Other embodiments may be utilized and derived there-from, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein individually or collectively by the term "invention" merely for convenience and without intending to voluntarily limit the scope of this application to any single invention or inventive concept, if more than one is in fact disclosed. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the present disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the claims. In the foregoing Detailed Description, various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. Thus the following claims are hereby incorporated into the Detailed Description, with each claim standing on its own as a separate embodiment.

The invention claimed is:

1. An integrated circuit comprising:
a first non-conductive layer;
a first metal layer overlying the first non-conductive layer, the first metal layer comprising:
  i) a ground return region of a substantially symmetrical shape with respect to a centerline of the ground return region, isolated from a remaining portion of the first metal layer;
  ii) a first transmission line of a substantially symmetrical shape with respect to the centerline, formed within the ground return region, separated from the ground return region by a first transmission line fixed distance gap region along an entire length of the first transmission line; and
  iii) a second transmission line of a substantially symmetrical shape with respect to the centerline, the second transmission line comprising a first segment and a last segment collinear with the first segment, the first segment and the last segment formed within the ground return region and separated from the ground return region respectively by a first segment fixed distance gap region and a last segment fixed distance gap region along entire lengths of the first and last segments, the first segment and the last segment separated from one another at a middle region of the second transmission line;
a second non-conductive layer overlying the first metal layer; and
a second metal layer comprising a middle segment of the second transmission line collinear with the first and last segments and electrically connected to the first and last segments through vias formed in the second non-conductive layer,
wherein:
the first transmission line and the second transmission line cross at the middle region of the second transmission line to form a symmetrical crossing pattern with respect to the centerline.

2. The integrated circuit according to claim 1, further comprising:
a third non-conductive layer overlying the first metal layer and separating the first metal layer and the second non-conductive layer; and
a third metal layer overlying the third non-conductive layer and separating the third non-conductive layer and the second non-conductive layer, the third metal layer comprising a ground shield region isolated from a remaining portion of the third metal layer, the ground shield region having a symmetrical geometry with respect to the centerline of the ground return region, the ground shield region comprising:
  a) a center region comprising two crossing lines crossing at the centerline of the ground return region, the crossing lines defining a symmetrical crossing pattern of the center region comprising four extremes away from the centerline; and
  b) four regions of a substantially same geometry each connected to one of the four extremes of the symmetrical crossing pattern of the center region,
wherein:
the four regions are electrically connected to the ground return region through vias formed in the third non-conductive layer, and
projection of each of the four regions onto the ground return region clears regions of the first and the second transmission lines and respective fixed distance gap regions.

3. The integrated circuit according to claim 1 or claim 2, wherein the first transmission line and the second transmission line are oriented at 90 degrees with respect to one another.

4. The integrated circuit according to claim 2, wherein the substantially same geometry of the four regions of the ground shield region is a square region.

5. The integrated circuit according to claim 1, wherein a width of the first transmission line and a width of the second transmission line is substantially a same width.

6. The integrated circuit according to claim 2, wherein a width of the first transmission line and a width of the second transmission line is substantially a same width $W_T$.

7. The integrated circuit according to claim 6, wherein widths of the two crossing lines is substantially a same width $W_C$.

8. The integrated circuit according to claim 7, wherein the width $W_T$ is substantially equal to the width $W_C$.

9. The integrated circuit according to claim 7, wherein the width $W_T$ is substantially equal to two times the width $W_C$.

10. The integrated circuit according to claim 7, wherein the width $W_T$ is substantially equal to half the width $W_C$.

11. The integrated circuit according to claim 1, wherein the first transmission line and the first transmission line fixed distance gap region form a first coplanar waveguide, and the second transmission line, the first segment fixed distance gap region, and the last segment fixed distance gap region form a second coplanar waveguide.

12. The integrated circuit according to claim 2, wherein the first transmission line and the first transmission line fixed distance gap region form a first coplanar waveguide, and the second transmission line, the first segment fixed distance gap region, and the last segment fixed distance gap region form a second coplanar waveguide.

13. The integrated circuit according to claim 12, wherein the symmetrical geometry of the ground shield region is configured to control a signal coupling between the first and the second coplanar waveguides.

14. The integrated circuit according to claim 12, wherein widths of the two crossing lines of the center region of the ground shield region are configured to control a signal coupling between the first and the second coplanar waveguides.

15. An integrated circuit comprising:
a first non-conductive layer;
a first metal layer overlying the first non-conductive layer, the first metal layer comprising:
  i) a ground return region of a substantially symmetrical shape with respect to a centerline of the ground return region, isolated from a remaining portion of the first metal layer;
  ii) a first transmission line of a substantially symmetrical shape with respect to the centerline, formed within the ground return region, separated from the ground return region by a fixed distance gap along a length of the first transmission line; and
  iii) a second transmission line of a substantially symmetrical shape with respect to the centerline, formed within the ground return region, the second transmission line comprising a first segment and a last segment collinear with the first segment, the first segment and the last segment separated from the ground return region by the fixed distance gap along the length of the first and last segments, the first segment and the last segment separated from one another at a middle region of the second transmission line;
a second non-conductive layer overlying the first metal layer; and
a second metal layer comprising a middle segment of the second transmission linecollinear with the first and last segments and electrically connected to the first and last segments through vias formed in the second non-conductive layer,
wherein:
the first transmission line and the second transmission line cross at the middle region of the second transmission line to form a symmetrical crossing pattern with respect to the centerline, and
the integrated circuit further comprises:
  a third non-conductive layer overlying the first metal layer and separating the first metal layer and the second non-conductive layer; and
  a third metal layer overlying the third non-conductive layer and separating the third non-conductive layer and the second non-conductive layer, the third metal layer comprising a ground shield region isolated from a remaining portion of the third metal layer, the ground shield region having a symmetrical geometry with respect to the centerline of the ground return region, the ground shield region comprising:
    a) a center region comprising two crossing lines crossing at the centerline of the ground return region, the crossing lines defining a symmetrical crossing pattern of the center region comprising four extremes away from the centerline; and
    b) four regions of a substantially same geometry each connected to one of the four extremes of the symmetrical crossing pattern of the center region,
    wherein:
    the four regions are electrically connected to the ground return region through vias formed in the third non-conductive layer, and
    projection of each of the four regions onto the ground return region clears regions of the first and the second transmission lines and corresponding fixed distance gap regions.

16. An integrated circuit comprising:
a first coplanar waveguide comprising a first transmission line;
a second coplanar waveguide comprising a second transmission line, the first coplanar waveguide crossing the second coplanar waveguide,
wherein:
the first coplanar waveguide and the second coplanar waveguide are formed on a first metal layer of a layered substrate at the exception of a middle segment of the second transmission line formed on a second metal layer of the layered substrate.

17. The integrated circuit according to claim 16, wherein: the second transmission line comprises:
i) a first segment formed on the first metal layer;
ii) a last segment, separated from the first segment, formed on the first metal layer; and
iii) the middle segment formed on the second metal layer, the middle segment electrically connecting the first segment and the last segment, and
the first transmission line crosses the second transmission line at a separation region between the first segment and the last segment of the second transmission line.

18. The integrated circuit according to claim 17, further comprising:
a contiguous ground shield formed in a third metal layer that is between the first metal layer and the second metal layer, the contiguous ground shield configured to create a shield between the first transmission line and the middle segment of the second transmission line at a crossing region of the first transmission line and the middle segment of the second transmission line.

19. The integrated circuit according to claim 18, wherein the integrated circuit is symmetrical with respect to a centerline coinciding with a middle point of the first coplanar waveguide and a middle point of the second coplanar waveguide.

20. The integrated circuit according to any one of the claims 16-19, wherein the first and the second coplanar waveguides have matching electrical characteristics.

21. The integrated circuit according to any one of claims 16-19, wherein the layered substrate comprises one of: a) a high resistivity silicon substrate, and b) a sapphire substrate.

22. The integrated circuit according to claim 18, wherein a center of a crossing region of the first and the second coplanar waveguides coincides with the centerline.

23. The integrated circuit according to claim 19, wherein the contiguous ground shield comprises a middle cross-shaped region joining four lateral regions.

24. The integrated circuit according to claim 23, wherein the four lateral regions are equally shaped.

25. The integrated circuit according to claim 23, wherein the four lateral regions are shaped according to a square pattern.

26. The integrated circuit according to claim 23, wherein the middle cross-shaped region is formed by two crossing lines forming a common middle region, the common middle region forming the shield between the first transmission line and the middle segment of the second transmission line.

27. The integrated circuit according to claim 26, wherein widths of the two crossing lines that determine an area of the common middle region forming the shield are configured to control a signal coupling between the first and the second coplanar waveguides.

* * * * *